US012648264B2

(12) United States Patent
Kim et al.

(10) Patent No.: US 12,648,264 B2
(45) Date of Patent: Jun. 2, 2026

(54) DISPLAY DEVICE USING SEMICONDUCTOR LIGHT-EMITTING DEVICES, AND METHOD FOR MANUFACTURING SAME

(71) Applicant: LG ELECTRONICS INC., Seoul (KR)

(72) Inventors: Jungsub Kim, Seoul (KR); Gunho Kim, Seoul (KR); Yoonchul Kim, Seoul (KR); Jisoo Ko, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 551 days.

(21) Appl. No.: 18/266,081

(22) PCT Filed: Dec. 9, 2020

(86) PCT No.: PCT/KR2020/017903
§ 371 (c)(1),
(2) Date: Jun. 8, 2023

(87) PCT Pub. No.: WO2022/124439
PCT Pub. Date: Jun. 16, 2022

(65) Prior Publication Data
US 2024/0038930 A1     Feb. 1, 2024

(51) Int. Cl.
H10H 20/819     (2025.01)
H10H 20/01     (2025.01)
H10W 90/00     (2026.01)

(52) U.S. Cl.
CPC ........ H10H 20/819 (2025.01); H10H 20/018 (2025.01); H10W 90/00 (2026.01)

(58) Field of Classification Search
None
See application file for complete search history.

(56) References Cited

U.S. PATENT DOCUMENTS

| | | | | |
|---|---|---|---|---|
| 12,512,443 B2 * | 12/2025 | Ko | ...................... | H01L 25/0753 |
| 2006/0220989 A1 * | 10/2006 | Hillis | .................... | G09G 3/001 |
| | | | | 345/30 |
| 2020/0127060 A1 | 4/2020 | Li et al. | | |
| 2022/0367757 A1 * | 11/2022 | Moon | .................. | H10H 20/857 |

FOREIGN PATENT DOCUMENTS

| | | |
|---|---|---|
| JP | 2006-128730 A | 5/2006 |
| KR | 10-2017-0124071 A | 11/2017 |
| KR | 10-2018-0089771 A | 8/2018 |
| KR | 10-2019-0099164 A | 8/2019 |
| KR | 10-2020-0026678 A | 3/2020 |

* cited by examiner

*Primary Examiner* — Bradley Smith
(74) *Attorney, Agent, or Firm* — Birch, Stewart, Kolasch & Birch, LLP

(57) ABSTRACT

A display device according to the present invention comprises: a wiring board including a plurality of pixel areas; and semiconductor light-emitting devices disposed in the pixel areas, wherein the pixel areas include semiconductor light-emitting devices having different shapes and emitting different colors, and wherein the wiring board has two or more pixel areas having different arrangements of the semiconductor light-emitting devices. The present invention may be used as an align key when manufacturing a display device by varying the arrangement of semiconductor light-emitting devices in some pixel areas.

18 Claims, 20 Drawing Sheets

155  154  153  159

155  154  153

159

156        155  154  153

159

(a)

(b)

(a)

(b)

C

DISPLAY DEVICE USING SEMICONDUCTOR LIGHT-EMITTING DEVICES, AND METHOD FOR MANUFACTURING SAME

CROSS REFERENCE TO RELATED APPLICATIONS

This application is the National Phase of International Application No. PCT/KR2020/017903 filed on Dec. 9, 2020, which is hereby expressly incorporated by reference into the present application.

TECHNICAL FIELD

The present disclosure relates to a display device including semiconductor light-emitting devices (elements), specifically, semiconductor light-emitting devices having a size of several to several tens of μm, and a method for manufacturing the same.

BACKGROUND ART

In recent years, in the field of display technology, liquid-crystal displays (LCDs), organic light-emitting diodes (OLED) displays, semiconductor light-emitting displays, etc. have been competing to realize large-area displays.

Semiconductor light-emitting devices (elements, diodes) (hereinafter, microLEDs) with a cross-sectional area of 100 μm, when used in displays, may offer very high efficiency because the displays do not need a polarizer to absorb light. However, in order to implement large-scale displays, several millions of semiconductor light-emitting devices (elements) are required, which makes it difficult to transfer the semiconductor light-emitting devices, compared to other technologies.

In recent years, microLEDs can be transferred by pick & place, laser lift-off or self-assembly. Among others, the self-assembly approach is a method that allows semiconductor light-emitting devices to find their positions on their own in a fluid, which is most advantageous in realizing large-screen display devices.

Self-assembly methods may include a method of directly assembling semiconductor light-emitting devices on a final substrate to be used in a product, and a method of assembling semiconductor light-emitting devices on an assembly substrate and transferring the semiconductor light-emitting devices to a final substrate through an additional transfer process. The direct transfer method is efficient in terms of process, and the hybrid-transfer method is advantageous in terms of additionally using a structure for self-assembly without limitation. Therefore, the two methods are selectively used.

DISCLOSURE OF INVENTION

Technical Problem

One aspect of the present disclosure is to provide a high-resolution display device having red, green, and blue semiconductor light-emitting devices as unit pixels.

Another aspect of the present disclosure is to provide a method for manufacturing a display device with high reliability using high-resolution semiconductor light-emitting devices.

Solution to Problem

To achieve the above aspects and other advantages as embodied and broadly described herein, there is provided a display device that includes a wiring substrate including a plurality of pixel areas; and semiconductor light-emitting devices disposed in each of the pixel areas, wherein each of the pixel areas includes semiconductor light-emitting devices having different shapes while emitting different colors of light, and the wiring substrate includes two or more pixel areas having a different arrangement of the semiconductor light-emitting elements.

In an embodiment disclosed herein, the pixel area includes a first semiconductor light-emitting device emitting blue light and having a first shape, a second semiconductor light-emitting device emitting green light and having a second shape, and a third semiconductor light-emitting device emitting red light and having a third shape.

In an embodiment disclosed herein, the pixel areas include a first pixel area disposed on the wiring substrate in a matrix configuration, and including the first to third semiconductor light-emitting devices having a first arrangement; and a second pixel area including the first to third semiconductor light emitting devices having an arrangement different from the first arrangement, and the wiring substrate includes the first pixel areas more than the second pixel areas.

In an embodiment disclosed herein, at least some of the pixel areas disposed on portions adjacent to corners of the wiring substrate are the second pixel areas.

In an embodiment disclosed herein, the second pixel areas are discontinuously disposed on the wiring substrate.

In an embodiment disclosed herein, some of the second pixel areas are continuously disposed along at least one of a row direction and a column direction.

In an embodiment disclosed herein, the second pixel area is configured such that at least one of an arrangement order and an arrangement direction of the first to third semiconductor light-emitting elements is different from that of the first arrangement.

In an embodiment disclosed herein, the arrangement of the first to third semiconductor light-emitting devices is the same in all the second pixel areas disposed on the wiring substrate.

In an embodiment disclosed herein, the arrangement of the first to third semiconductor light-emitting devices is the same in some of the second pixel areas disposed on the wiring substrate.

In an embodiment disclosed herein, the pixel area further includes redundant first to third semiconductor light-emitting devices.

To achieve the above aspects and other advantages as embodied and broadly described herein, there is provided a method for manufacturing a display device including semiconductor light-emitting devices having different shapes while emitting different colors of light in pixel areas, the method including: assembling semiconductor light-emitting devices on an assembly substrate; transferring the semiconductor light-emitting devices assembled on the assembly substrate onto a transfer substrate; and transferring the semiconductor light-emitting devices transferred to the transfer substrate onto a wiring substrate, wherein the assembly substrate and the wiring substrate include two or more pixel areas having different arrangements of the semiconductor light-emitting elements, and the transferring the semiconductor light-emitting devices transferred to the transfer substrate onto the wiring substrate is performed based on at least one of the two or more pixel areas.

In an embodiment disclosed herein, each of the assembly substrate and the wiring substrate includes first pixel areas in which the semiconductor light-emitting devices are disposed in a first arrangement; and second pixel areas in which the semiconductor light-emitting devices are disposed in an arrangement different from the first arrangement, and the transferring the semiconductor light-emitting devices transferred to the transfer substrate onto the wiring substrate is performed based on the second pixel areas.

In an embodiment disclosed herein, the assembly substrate and the transfer substrate include first alignment patterns, respectively, and the transferring the semiconductor light-emitting devices assembled on the assembly substrate to the transfer substrate includes: aligning the transfer substrate on one side of the assembly substrate so that the first alignment patterns of the assembly substrate and the transfer substrate overlap each other; and bonding the assembly substrate and the transfer substrate.

In an embodiment disclosed herein, the transfer substrate and the wiring substrate include first alignment patterns, respectively, and the transferring the semiconductor light-emitting devices transferred to the transfer substrate onto the wiring substrate includes: aligning the transfer substrate on one side of the wiring substrate so that the first alignment patterns of the transfer substrate and the wiring substrate overlap each other; aligning the transfer substrate on one side of the wiring substrate by recognizing the semiconductor light-emitting devices transferred to the transfer substrate in an arrangement corresponding to the arrangement in the second pixel area; and bonding the transfer substrate and the wiring substrate.

In an embodiment disclosed herein, the transfer substrate includes semiconductor light-emitting devices disposed in an arrangement corresponding to that of the second pixel area in the vicinity of at least two or more corners after the semiconductor light-emitting devices assembled on the assembly substrate is transferred to the transfer substrate.

In an embodiment disclosed herein, the transfer substrate includes a plurality of first alignment patterns adjacent to corners, and the assembly substrate and the wiring substrate include the first alignment patterns at positions corresponding to the first alignment patterns of the transfer substrate.

In an embodiment disclosed herein, the transferring the semiconductor light-emitting devices transferred to the transfer substrate onto the wiring substrate is performed repeatedly a plurality of times.

In an embodiment disclosed herein, the assembling the semiconductor light-emitting devices on the assembly substrate is configured to self-assemble the semiconductor light-emitting devices in a fluid on the assembly substrate using an electric field and a magnetic field.

In an embodiment disclosed herein, the semiconductor light-emitting devices include a first semiconductor light-emitting device emitting blue light and having a first shape, a second semiconductor light-emitting device emitting green light and having a second shape, and a third semiconductor light-emitting device emitting red light and having a third shape, and the assembling the semiconductor light-emitting devices on the assembly substrate is configured to simultaneously assemble the first to third semiconductor light-emitting devices on the assembly substrate.

In an embodiment disclosed herein, the method may further include electrically connecting the semiconductor light-emitting devices transferred to the wiring substrate and the wiring substrate.

Advantageous Effects of Invention

The present disclosure can manufacture a display device having improved transfer accuracy and high reliability by configuring a sub pixel arrangement in pixel areas adjacent to corners to be different from a sub pixel arrangement in the remaining pixel areas and utilizing such sub pixel areas with the different arrangement as alignment keys during a transfer process.

Since some of semiconductor light-emitting devices serving as sub pixels of a display device are utilized as alignment keys, it is not necessary to manufacture separate alignment keys, thereby reducing process time and costs, and manufacturing a display device with high resolution.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the embodiment described herein can be applied as long as it can include a display even in a new product form to be developed later.

Figure 1:
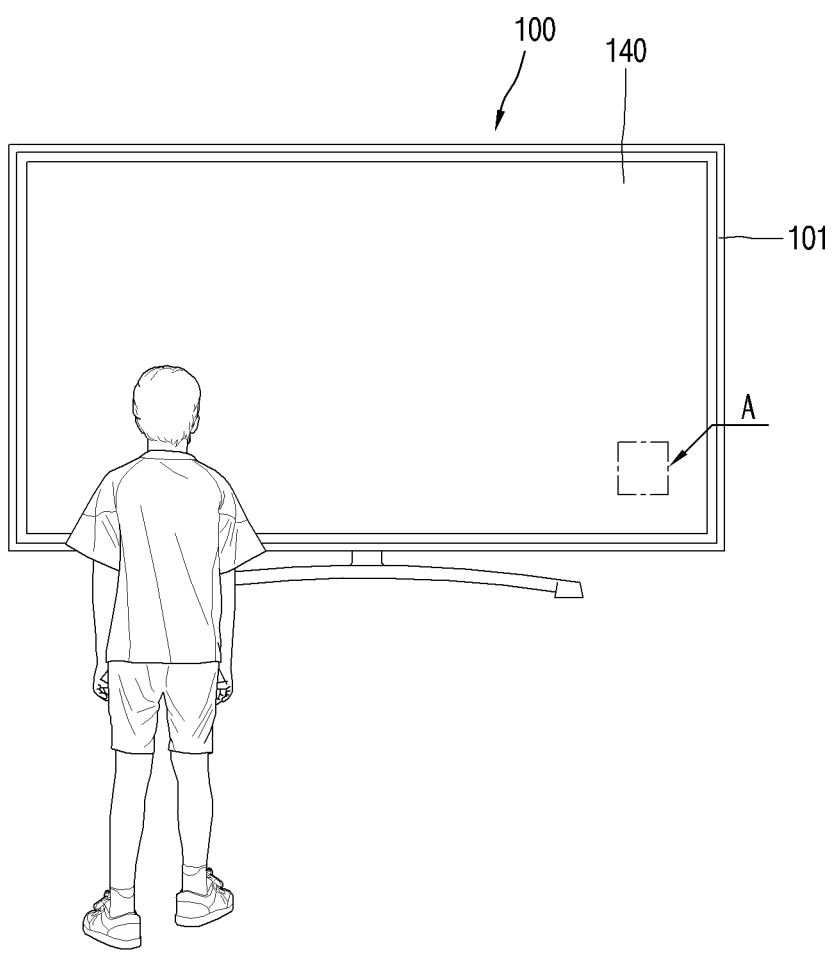
FIG. 1 is a conceptual view illustrating one embodiment of a display device using semiconductor light-emitting devices.
Figure 2:
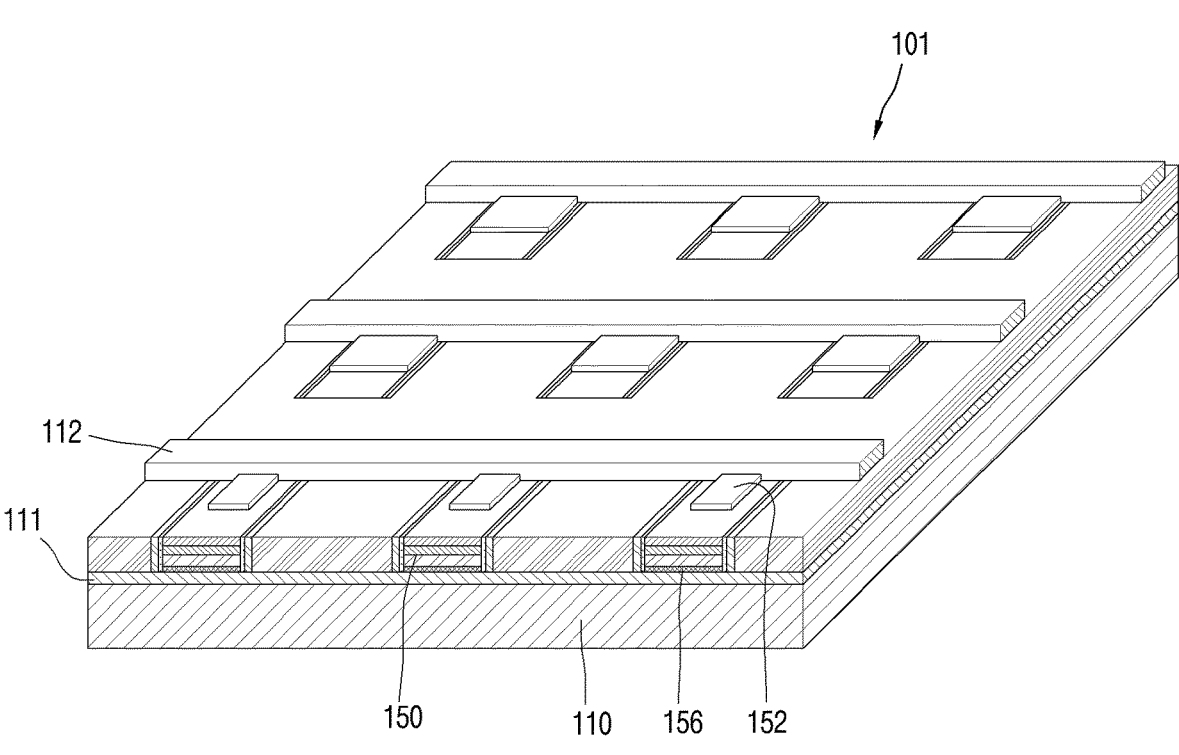
FIG. 2 is a partial enlarged view of a portion A in the display device of FIG. 1.
Figure 3:
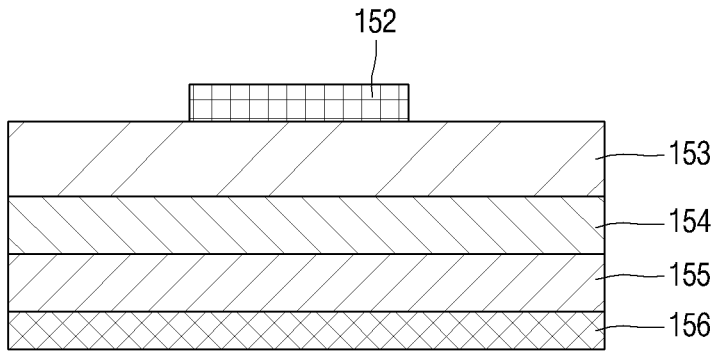
FIG. 3 is an enlarged view of the semiconductor light-emitting device of FIG. 2.
Figure 4:
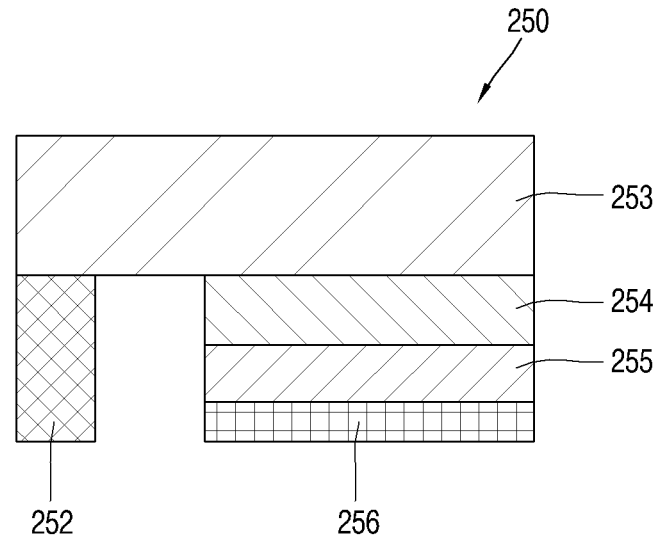
FIG. 4 is a view illustrating another embodiment of the semiconductor light-emitting device of FIG. 2.

FIG. 1 is a conceptual view illustrating one embodiment of a display device using semiconductor light-emitting devices, FIG. 2 is a partial enlarged view of a portion A in the display device of FIG. 1, FIG. 3 is an enlarged view of the semiconductor light-emitting device of FIG. 2, and FIG. 4 is a view illustrating another embodiment of the semiconductor light-emitting device of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting devices (or elements) 150 and a wiring substrate 110 where the semiconductor light-emitting devices 150 are mounted.

The wiring substrate 110 may be provided with wirings, which can be connected to n-type electrodes 152 and p-type electrodes 156 of the semiconductor light-emitting devices 150. As such, the semiconductor light-emitting devices 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting devices) as an example of the semiconductor light-emitting devices 150 which convert current into light. The microLEDs may be light-emitting devices that are small in size less than 100 μm. The semiconductor light-emitting devices 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting device 150 may have a vertical structure.

For example, the semiconductor light-emitting devices 150 may be implemented as high-power light-emitting devices that are composed mostly of gallium nitride (GaN), with some indium (In) and/or aluminum (Al) added to it, and emit light of various colors.

Such a vertical semiconductor light-emitting device may include a p-type electrode 156, a p-type semiconductor layer 155 disposed on the p-type semiconductor layer 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting device. The electrodes can be disposed in an upward/downward direction in the vertical semiconductor light-emitting device 150, thereby providing a great advantage of reducing a chip size.

In another example, referring to FIG. 4, the semiconductor light-emitting devices may be flip chip-type light-emitting devices.

As an example of such a flip chip-type light-emitting device, the semiconductor light-emitting device 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting device.

The vertical semiconductor light-emitting device and a flip-type light-emitting device each may be used as a green semiconductor light-emitting device, blue semiconductor light-emitting device, or red semiconductor light-emitting device. The green semiconductor light-emitting device and the blue semiconductor light-emitting device may be implemented as high-power light-emitting devices that are composed mostly of gallium nitride (GaN), with some indium (In) and/or aluminum (Al) added to it, and emit green and blue light, respectively. As an example, the semiconductor light-emitting devices may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting device, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting devices may be semiconductor light-emitting devices without the active layer.

In some examples, referring to FIGS. 1 to 4, because of the very small size of the light-emitting devices, self-emissive, high-definition unit pixels may be arranged on the display panel, and therefore the display device can deliver high picture quality.

In the display device using the semiconductor light-emitting devices, semiconductor light-emitting devices may be grown on a wafer, formed through mesa and isolation, and used as individual pixels. The micro-sized semiconductor light-emitting devices 150 should be transferred onto preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting devices.

In this specification, a display device using passive matrix (PM) semiconductor light-emitting devices will be illustrated. It should be noted that the illustration given below is also applied to active matrix (AM) semiconductor light-emitting devices. In addition, the self-assembly method described in this specification can be applied to both horizontal semiconductor light-emitting devices and vertical semiconductor light-emitting devices.

Figure 5A:
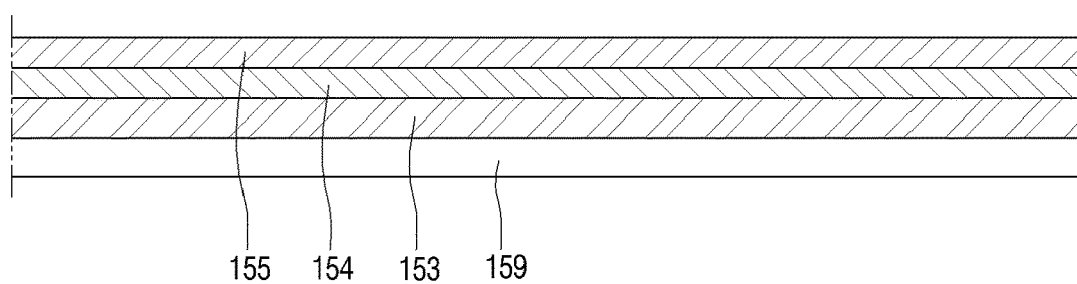
FIGS. 5A to 5E are conceptual diagrams illustrating a new process for manufacturing semiconductor light-emitting devices.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary embodiment is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
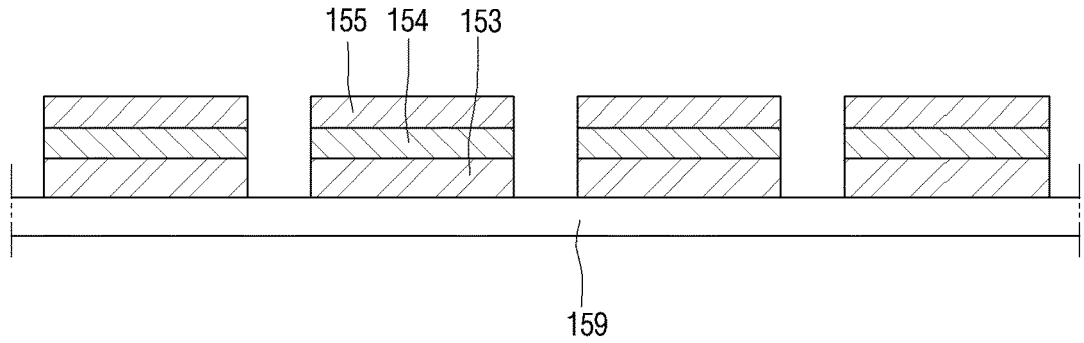

Next, a plurality of semiconductor light-emitting devices may be formed by removing at least parts of the first conductive semiconductor layer 153, the active layer 154, and the second conductive semiconductor layer 155 (FIG. 5B).

More specifically, isolation may be performed so that the plurality of light-emitting devices form a light-emitting device array. That is, a plurality of semiconductor light-emitting devices may be formed by vertically etching the first conductive semiconductor layer 153, the active layer 154, and the second conductive semiconductor layer 155.

In the case of horizontal semiconductor light-emitting devices, a mesa process may be performed which exposes the first conductive semiconductor layer 153 to the outside by vertically removing part of the active layer 154 and the second conductive semiconductor layer 155, and then isolation may be performed which forms an array of semiconductor light-emitting devices by etching the first conductive semiconductor layer 153.

Figure 5C:
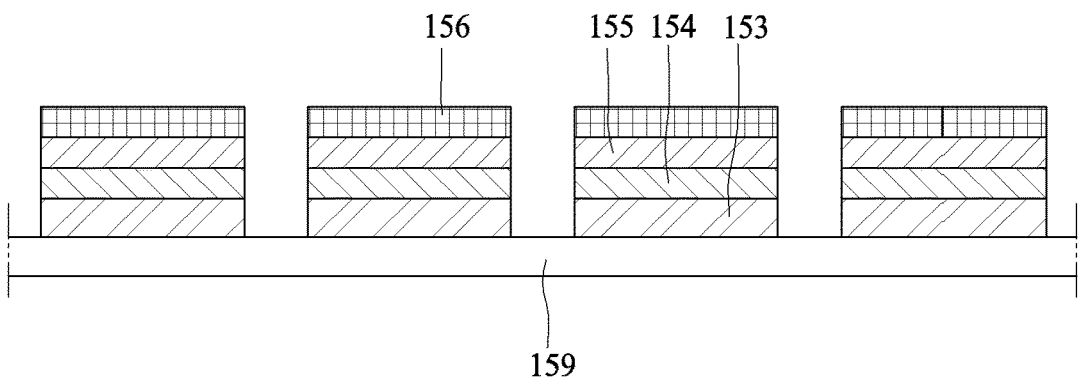

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
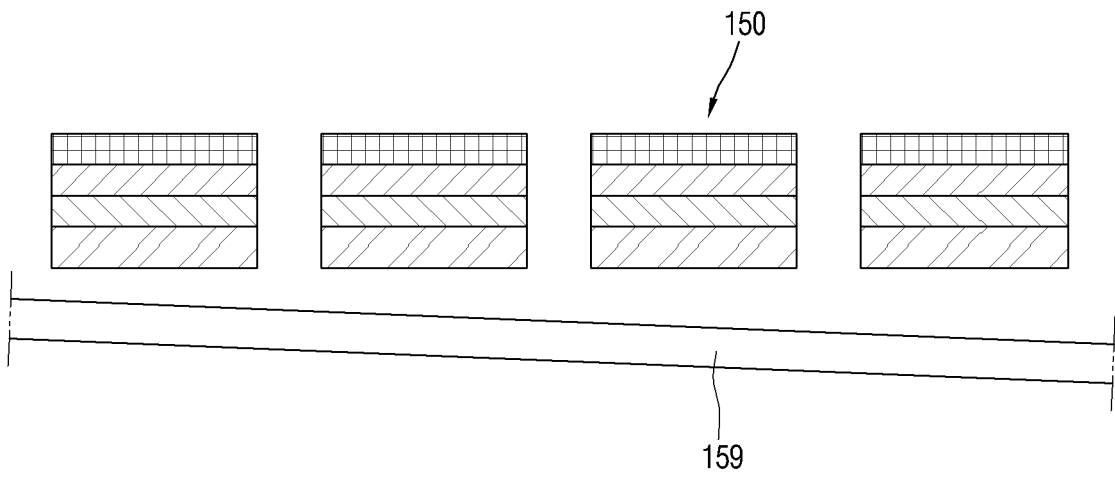

Next, the growth substrate 159 may be removed, thus leaving a plurality of semiconductor light-emitting devices. For example, the growth substrate 159 may be removed using laser lift-off (LLO) or chemical lift-off (CLO) (FIG. 5D).

Figure 5E:
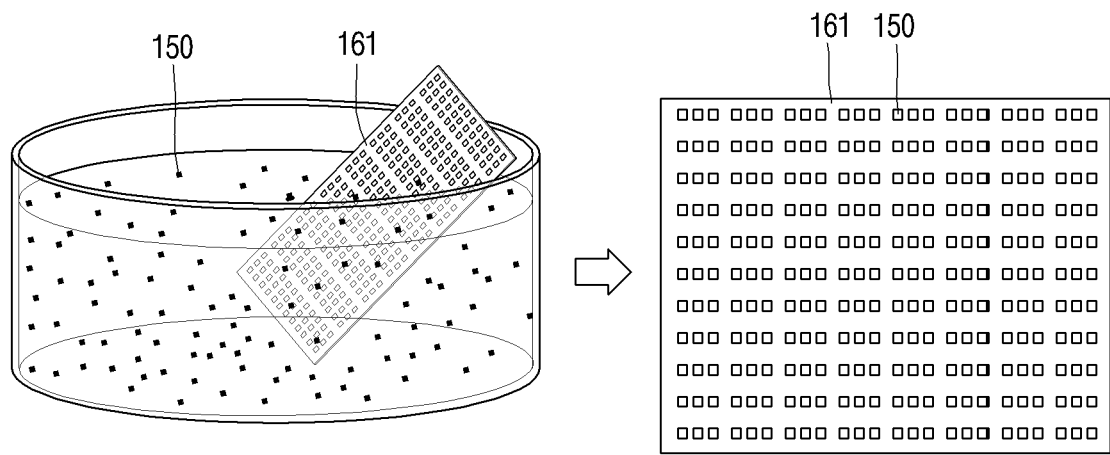

Afterwards, the step of mounting the semiconductor light-emitting devices 150 on a substrate in a chamber filled with a fluid may be performed (FIG. 5E).

For example, the semiconductor light-emitting devices 150 and the substrate 161 may be put into a chamber filled with a fluid, and the semiconductor light-emitting devices may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting devices 150 may be mounted directly onto the wiring substrate. In this case, the substrate may be a wiring substrate. For convenience of explanation, the present disclosure is illustrated with an example in which the semiconductor light-emitting devices 150 are mounted onto the assembly substrate 161.

To facilitate the mounting of the semiconductor light-emitting devices 150 onto the assembly substrate 161, cells (not illustrated) into which the semiconductor light-emitting devices 150 are fitted may be provided on the assembly substrate 161. Specifically, cells where the semiconductor light-emitting devices 150 are mounted may be disposed on the assembly substrate 161 at positions where the semiconductor light-emitting devices 150 are aligned with wiring electrodes. The semiconductor light-emitting devices 150 may be assembled to the cells as they move within the fluid.

After arraying the semiconductor light-emitting devices 150 on the assembly substrate 161, the semiconductor light-emitting devices 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting devices so that the semiconductor light-emitting devices are moved by magnetic force, and the semiconductor light-emitting devices may be mounted at preset positions by an electric field in the process of being moved. This transfer method and device will be described in more detail below with reference to the accompanying drawings.

Figure 6:
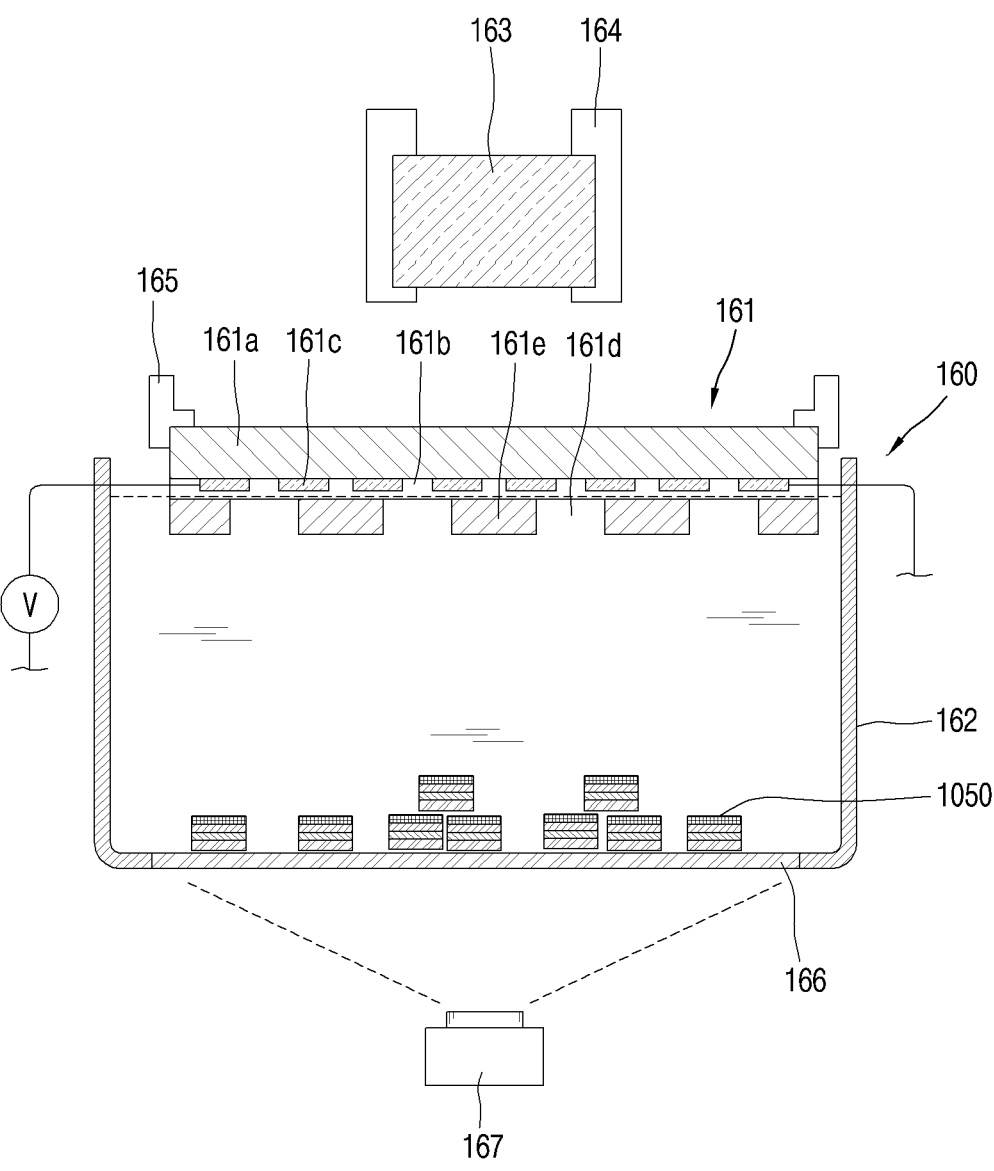
FIG. 6 is a conceptual diagram illustrating one embodiment of a self-assembly device for self-assembling semiconductor light-emitting devices according to the present disclosure.
Figure 7:
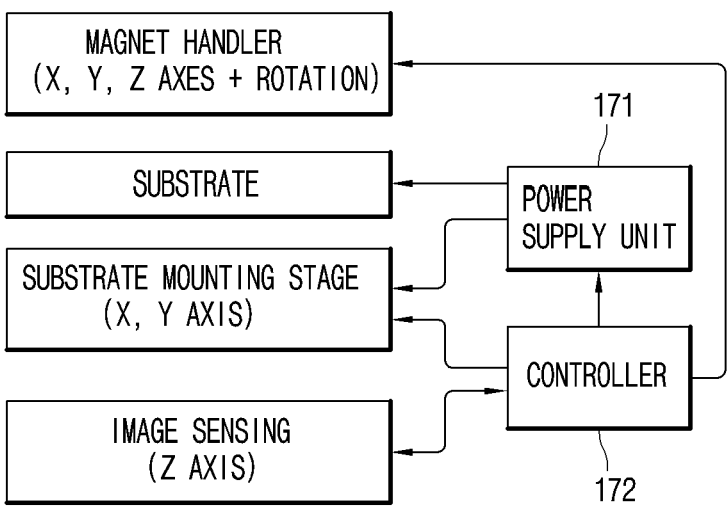
FIG. 7 is a block diagram of the self-assembly device of FIG. 6.

FIG. 6 is a conceptual diagram illustrating an example of a device for self-assembling semiconductor light-emitting devices and FIG. 7 is a block diagram of the self-assembly device of FIG. 6. FIGS. 8A to 8E are conceptual view illustrating a process for self-assembling semiconductor light-emitting devices using the self-assembly device of FIG. 6 and FIG. 9 is a conceptual view illustrating the semiconductor light-emitting device of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting devices. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting devices 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting devices 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of an inorganic material such as SiO2, SiNx, SiON, Al2O3, TiO2, HfO2, etc. Alternatively, the dielectric layer 161b may be an organic insulator and configured as a single layer or a multi-layer. The thickness of the dielectric layer 161b may range from several tens of nm to several μm.

Further, the substrate 161 according to the present disclosure includes a plurality of cells 161d that are separated by barrier walls. The cells 161d may be sequentially arranged in one direction and made of a polymer material. Furthermore, the barrier walls 161e defining the cells 161d may be made to be shared with neighboring cells 161d. The barrier walls 161e may protrude from the base portion 161a, and the cells 161d may be sequentially arranged in one direction by the barrier walls 161e. More specifically, the cells 161d may be sequentially arranged in column and row directions and have a matrix configuration.

As illustrated in the drawings, the cells 161d may have recesses for receiving the semiconductor light-emitting devices 150, and the recesses may be spaces defined by the barrier walls 161e. The recesses may have a shape identical or similar to the shape of the semiconductor light-emitting devices. For example, if the semiconductor light-emitting devices are rectangular, the recesses may be rectangular too. Although not shown, the recesses formed in the cells may be circular if the semiconductor light-emitting devices are circular. Also, each of the cells is configured to accommodate a single semiconductor light-emitting device. In other words, a single semiconductor light-emitting device is accommodated in a single cell.

Meanwhile, the plurality of electrodes 161c may have a plurality of electrode lines that are placed on bottoms of the cells 161d, and the plurality of electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting devices can be inserted into the cells 161d by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting devices. The magnet 163 may be disposed at a distance from the fluid chamber 162 to apply magnetic force to the semiconductor light-emitting devices 150. The magnet 163 may be disposed to face an opposite side of the assembly surface of the substrate 161, and the position of the magnet 163 may be controlled by the position controller 164 connected to the magnet 163.

The semiconductor light-emitting devices 1050 may have a magnetic material so that they can be moved within the fluid by a magnetic field.

Referring to FIG. 9, a semiconductor light-emitting device having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting device may be formed without the active layer.

Meanwhile, the first conductive electrode 1052 may be formed after the semiconductor light-emitting device is assembled onto the wiring substrate by the self-assembling of the semiconductor light-emitting device. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting device 1050 may include a first layer 1056a and a second layer 1056b, as illustrated in FIG. 9. Here, the first layer 1056a may include a magnetic material, and the second layer 1056b may include a metal material other than the magnetic material.

As illustrated in the drawing, in this example, the first layer 1056a including the magnetic material may be disposed in contact with the second conductive semiconductor layer 1055. In this case, the first layer 1056a may be disposed between the second layer 1056b and the second conductive semiconductor layer 1055. The second layer 1056b may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting devices may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting devices can be mounted at preset positions on the substrate by the electric field while being moved by changes in the position of the magnet. Hereinafter, the assembly process using the self-assembly device will be described in more detail.

First of all, a plurality of semiconductor light-emitting devices 1050 having a magnetic material may be formed through the process explained with reference to FIGS. 5A to 5C. In this case, the magnetic material may be deposited onto the semiconductor light-emitting devices in the process of forming the second conductive electrode of FIG. 5C.

Figure 8A:
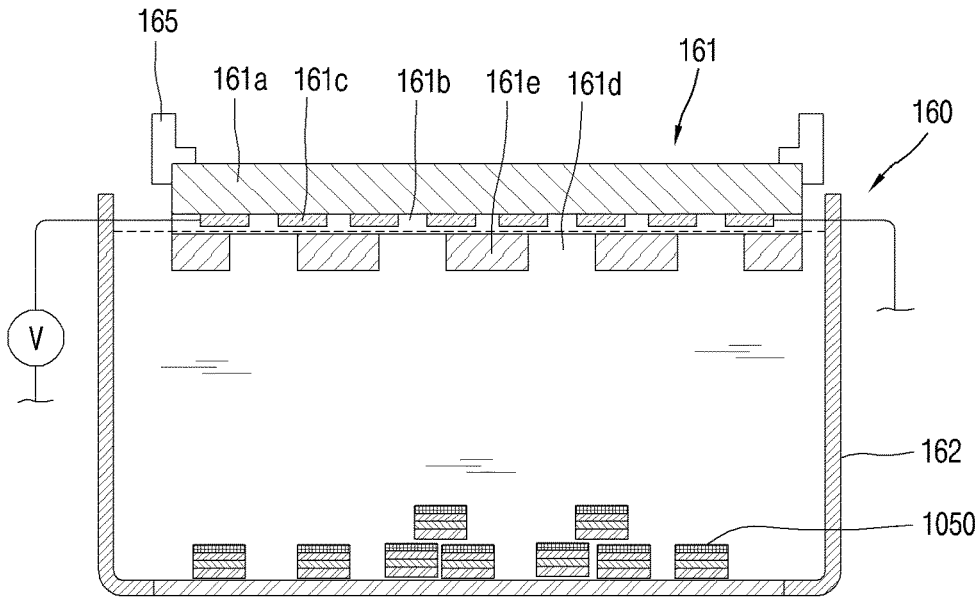
FIGS. 8A to 8E are conceptual views illustrating a process for self-assembling semiconductor light-emitting devices using the self-assembly device of FIG. 6.
Figure 9:
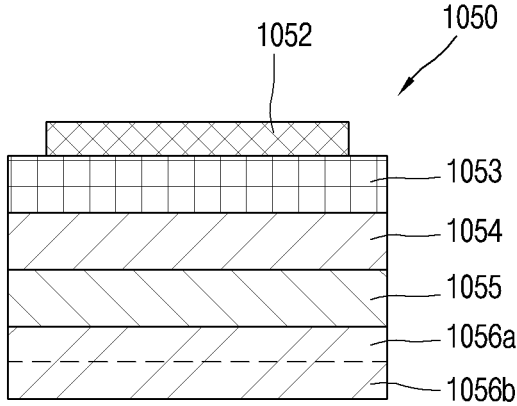
FIG. 9 is a view illustrating one embodiment of a semiconductor light-emitting device that is used in the self-assembly process of FIGS. 8A to 8E.

Next, the substrate 161 may be fed to an assembly site, and the semiconductor light-emitting devices 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting devices 150 are assembled faces downwards.

In this case, some of the semiconductor light-emitting devices 1050 may sink to the bottom of the fluid chamber 162 and some of them may float in the fluid. When the fluid chamber 162 is provided with the light-transmissive bottom plate 166, some of the semiconductor light-emitting devices 1050 may sink to the bottom plate 166.

Figure 8B:
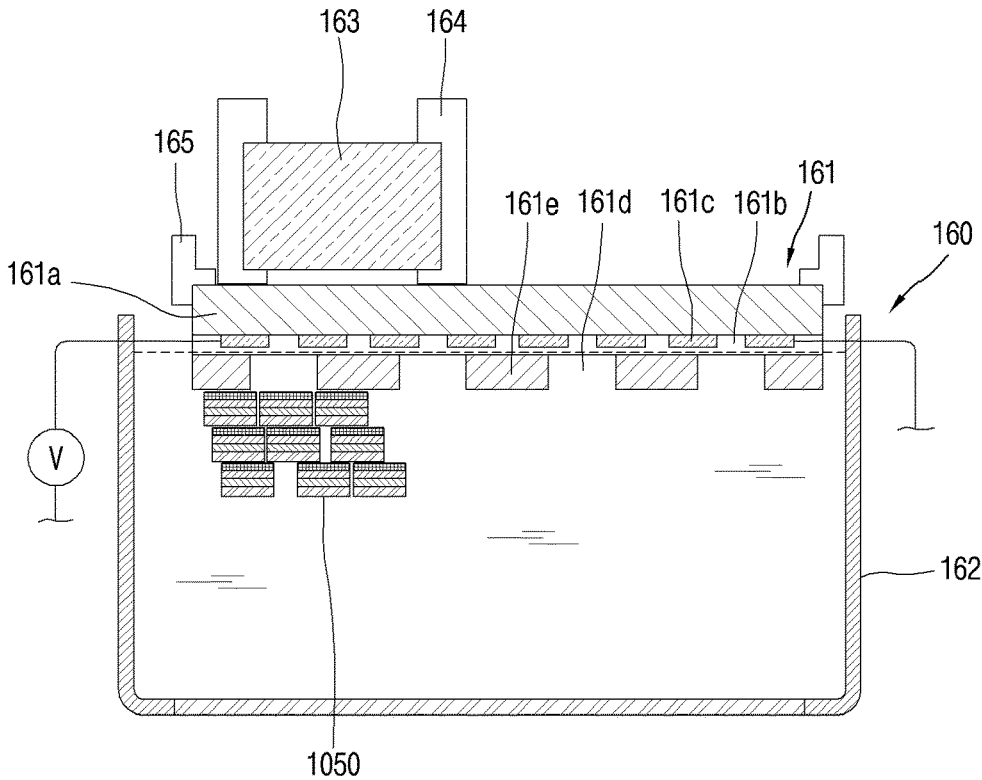

Next, magnetic force may be applied to the semiconductor light-emitting devices 1050 so that the semiconductor light-emitting devices 1050 in the fluid chamber 162 come up to the surface (FIG. 8B).

When the magnet 163 of the self-assembly device moves to the opposite side of the assembly surface of the substrate 161 from its original position, the semiconductor light-emitting devices 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this embodiment, the spacing between the assembly surface of the substrate 161 and the semiconductor light-emitting devices 1050 may be controlled by adjusting strength of the magnetic force. For example, the spacing may be controlled by using weight, buoyancy, and magnetic force of the semiconductor light-emitting devices 1050. The spacing may be several millimeters to several tens of micrometers from the outermost part of the substrate 161.

Figure 8C:
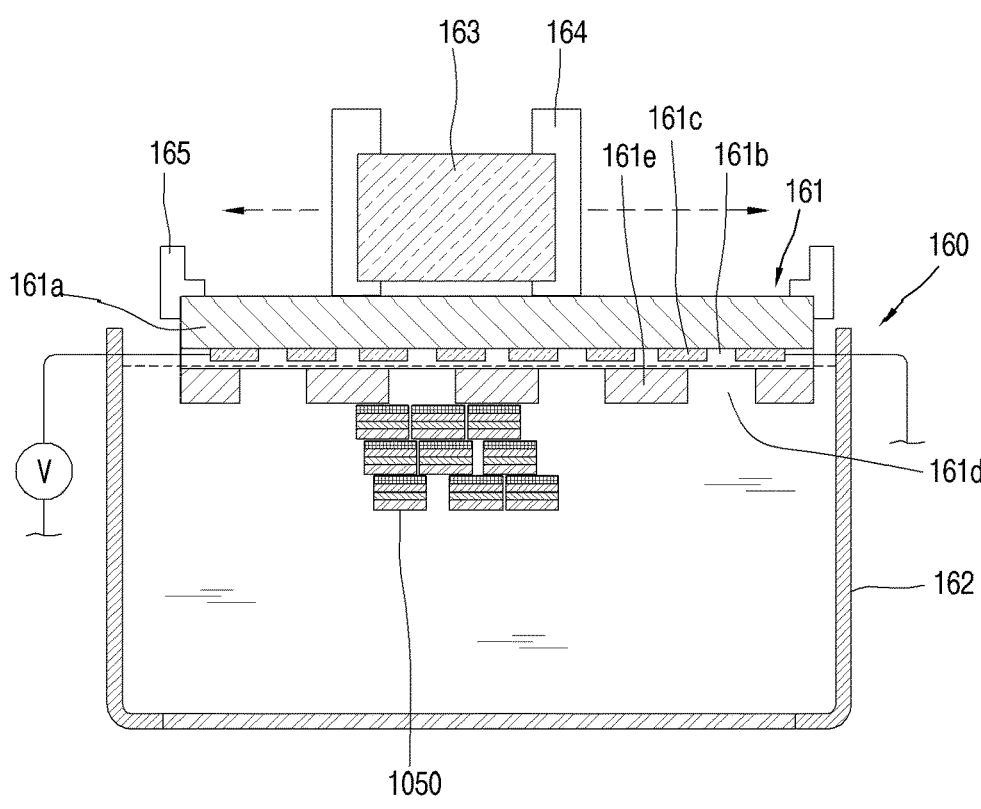

Next, magnetic force may be applied to the semiconductor light-emitting devices 1050 so that the semiconductor light-emitting devices 1050 can move in one direction within the fluid chamber 162. For example, the magnet 163 may move in a horizontal direction to the substrate, a clockwise direction, or a counterclockwise direction (FIG. 8C). In this case, the semiconductor light-emitting devices 1050 may be moved horizontally with respect to the substrate 161 by the magnetic force, with being spaced apart from the substrate 161.

Next, the semiconductor light-emitting devices 1050 may be guided to preset positions on the substrate 161 by applying an electric field so that the semiconductor light-emitting devices 1050 are mounted at the preset positions during their movement (FIG. 8C). For example, the semiconductor light-emitting devices 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting devices 1050 may be self-assembled at the assembly site on the substrate 161 by a selectively generated electric field. To this end, the substrate 161 may be provided with cells into which the semiconductor light-emitting devices 1050 are fitted.

Afterwards, unloading of the substrate 161 may be performed, thereby completing the assembly process. In a case where the substrate 161 is an assembly substrate, the assembled semiconductor light-emitting devices may be transferred onto a wiring substrate to carry out a subsequent process for realizing the display device, as described previously.

Meanwhile, after the semiconductor light-emitting devices 1050 are guided to the preset positions, the magnet 163 may be moved away from the substrate 161 such that the semiconductor light-emitting devices 1050 remaining in the fluid chamber 162 fall to the bottom of the fluid chamber 162

Figure 8D:
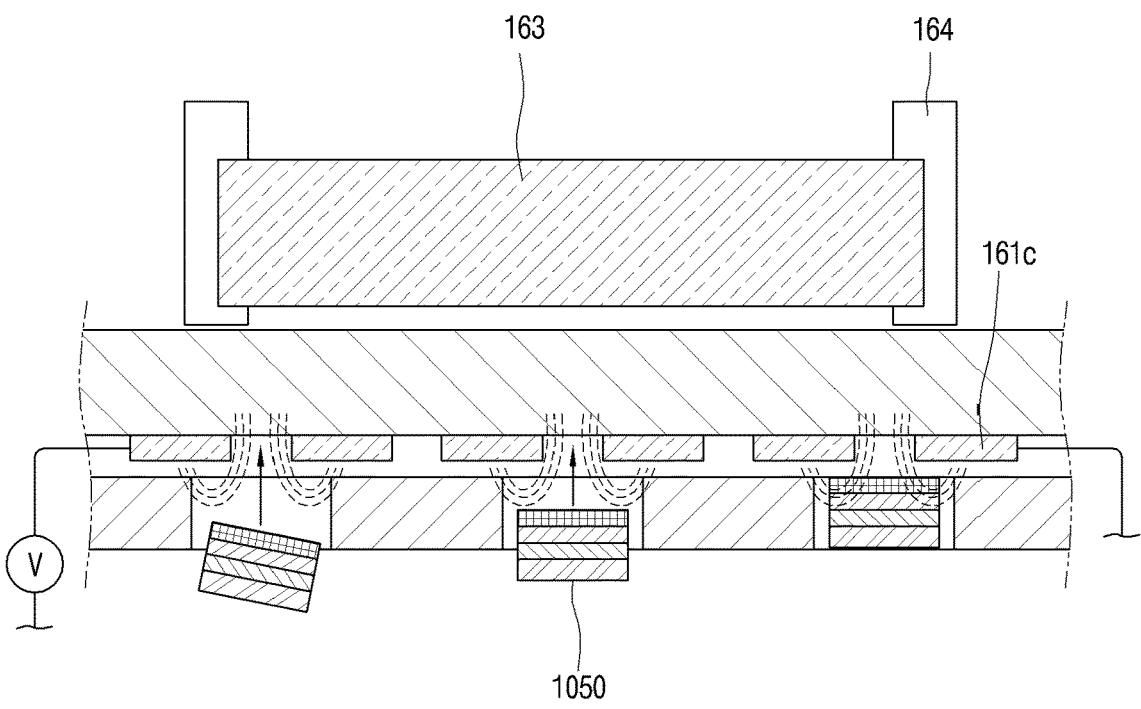
Figure 8E:
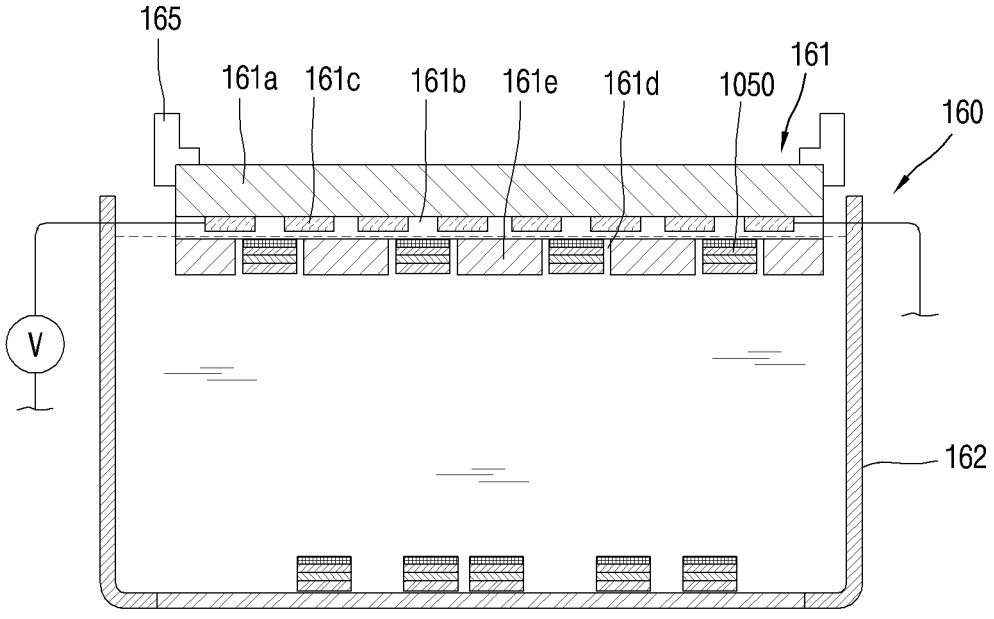

(FIG. 8D). In another example, when power supply is stopped in a case where the magnet 163 is an electromagnet, the semiconductor light-emitting devices 1050 remaining in the fluid chamber 162 may fall to the bottom of the fluid chamber 162.

Thereafter, the semiconductor light-emitting devices 1050 on the bottom of the fluid chamber 162 may be collected, and the collected semiconductor light-emitting devices 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting devices can be assembled at a time in a display device where individual pixels are made up of semiconductor light-emitting devices.

As such, a large number of semiconductor light-emitting devices can be pixelated on a small-sized wafer and then transferred onto a large-area substrate. This enables the manufacture of a large-area display device at a low cost.

Meanwhile, the present disclosure provides a structure and method of an assembly substrate for increasing the yields of the self-assembly process and the process yields after the self-assembly. The present disclosure is limited to a case where the substrate 161 is used as an assembly substrate. That is, the assembly substrate to be described later is not used as the wiring substrate of the display device. Hereinafter, the substrate 161 is referred to as an assembly substrate 161.

The present disclosure improves the process yields in two respects. First, the present disclosure prevents semiconductor light-emitting devices from being mounted on undesired positions due to an electric field strongly formed at the undesired positions. Second, the present disclosure suppresses the semiconductor light-emitting devices from remaining on the assembly substrate when transferring the semiconductor light-emitting devices mounted on the assembly substrate to another substrate.

The above-mentioned objectives are not individually achieved by different components. The above-described two objectives can be achieved by organic coupling of components to be described later and the assembly substrate 161 described above.

Before describing the present disclosure in detail, a post-process for manufacturing a display device after self-assembling will be described.

Figure 10A:
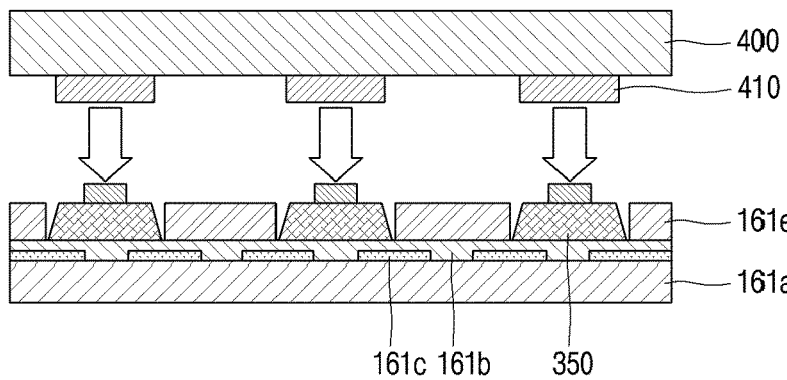
FIGS. 10A to 10C are conceptual views illustrating another transfer process of semiconductor light-emitting devices after a self-assembly process according to the present disclosure.
Figure 10B:
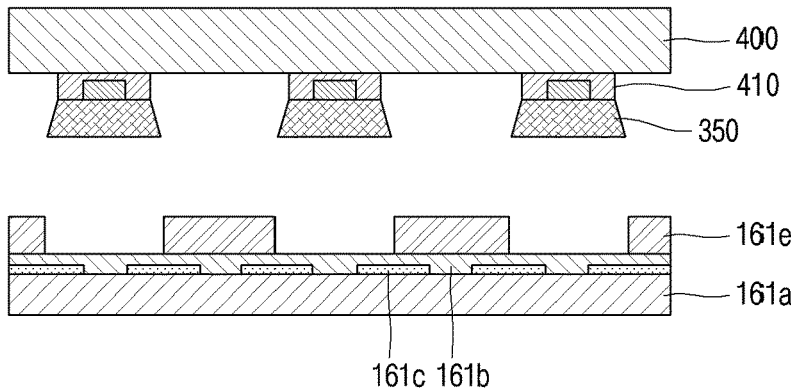
Figure 10C:
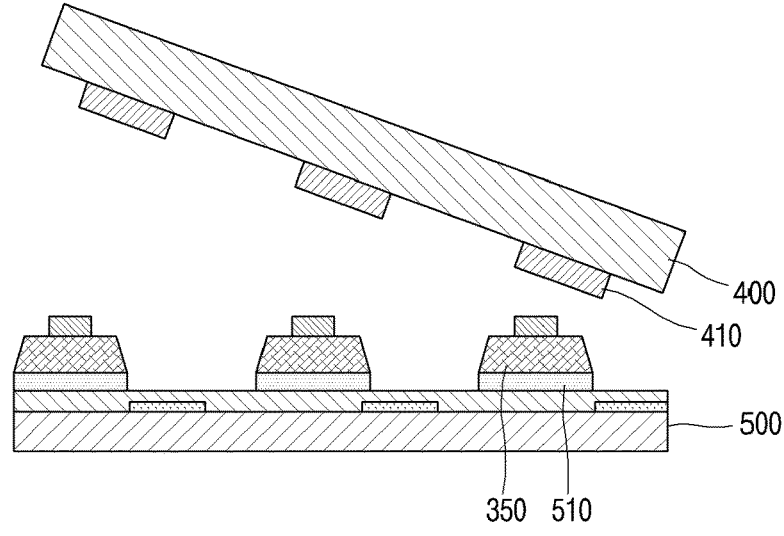

FIGS. 10A to 10C are conceptual diagrams illustrating a state in which the semiconductor light-emitting devices are transferred after a self-assembling process according to the present disclosure.

When the self-assembly process described with reference to FIGS. 8A to 8E is completed, the semiconductor light-emitting devices are mounted on the assembly substrate 161 at preset positions. The semiconductor light-emitting devices mounted on the assembly substrate 161 are transferred at least once to another substrate. The present disclosure illustrates one embodiment in which the semiconductor light-emitting devices mounted on the assembly substrate 161 are transferred twice, but the present disclosure is not limited thereto. The semiconductor light-emitting devices mounted on the assembly substrate 161 may be transferred to another substrate once or three times or more.

On the other hand, immediately after the self-assembly process is completed, the assembly surface of the assembly substrate 161 faces downwards (or the gravity direction). For the process after the self-assembly, the assembly substrate 161 may be turned by 180 degrees with the semiconductor light-emitting devices mounted thereon. In this process, there is a risk that the semiconductor light-emitting devices are likely to be separated from the assembly substrate 161. Therefore, a voltage must be applied to the plurality of electrodes 161c (hereinafter, referred to as assembly electrodes) while the assembly substrate 161 is turned. An electric field formed between the assembly electrodes prevents the semiconductor light-emitting devices from being separated from the assembly substrate 161 while the assembly substrate 161 is turned.

When the assembly substrate 161 is turned by 180 degrees after the self-assembly process, a shape as shown in FIG. 10A is made. Specifically, as shown in FIG. 10A, the assembly surface of the assembly substrate 161 is in a state of facing upwards (or the opposite direction to gravity). In this state, a transfer substrate 400 is aligned above the assembly substrate 161.

The transfer substrate 400 is a substrate for separating the semiconductor light-emitting devices placed on the assembly substrate 161 and transferring them to the wiring substrate. The transfer substrate 400 may be formed of PDMS (polydimethylsiloxane). Accordingly, the transfer substrate 400 may be referred to as a PDMS substrate.

The transfer substrate 400 is aligned above the assembly substrate 161 and then pressed onto the assembly substrate 161. When the transfer substrate 400 is fed above the assembly substrate 161, the semiconductor light-emitting devices 350 mounted on the assembly substrate 161 are transferred to the transfer substrate 400 by the adhesive force of the transfer substrate 400.

To this end, surface energy between the semiconductor light-emitting devices 350 and the transfer substrate 400 should be higher than surface energy between the semiconductor light-emitting devices 350 and the dielectric layer 161b. When there is a greater difference between the surface energy between the semiconductor light-emitting devices 350 and the transfer substrate 400 and the surface energy between the semiconductor light-emitting devices 350 and the dielectric layer 161b, the probability that the semiconductor light-emitting devices 350 are separated from the assembly substrate 161 is more increased. Therefore, it is preferable that the difference between the two surface energies is great.

Meanwhile, the transfer substrate 40 may include a plurality of protrusions 410 that allow pressure applied by the transfer substrate 400 to be concentrated on the semiconductor light-emitting devices 350 when pressing the transfer substrate 400 onto the assembly substrate 161. The protrusions 410 may be formed at the same interval as the semiconductor light-emitting devices mounted on the assembly substrate 161. When the transfer substrate 400 is pressed onto the assembly substrate 161 after the protrusions 410 are aligned to overlap the semiconductor light-emitting devices 350, the pressure applied by the transfer substrate 400 can be concentrated only on the semiconductor light-emitting devices 350. Thus, the present disclosure increases the probability that the semiconductor light-emitting devices are separated from the assembly substrate 161.

Meanwhile, in a state where the semiconductor light-emitting devices are mounted on the assembly substrate 161, parts of the semiconductor light-emitting devices are preferably exposed to the outside of recesses. If the semiconductor light-emitting devices 350 are not exposed to the outside of the recesses, the pressure applied by the transfer substrate 400 is not concentrated on the semiconductor light-emitting devices 350, which may lower the probability that the semiconductor light-emitting devices 350 are separated from the assembly substrate 161.

Lastly, referring to FIG. 10C, the step of pressing the transfer substrate 400 onto the wiring substrate 500 and transferring the semiconductor light-emitting devices 350 from the transfer substrate 400 to the wiring substrate 500 is carried out. At this time, the wiring substrate 500 may be provided with protrusions 510. The transfer substrate 400 and the wiring substrate 500 are aligned so that the semiconductor light-emitting devices 350 disposed on the transfer substrate 400 overlap the protrusions 510. Thereafter, when the transfer substrate 400 is pressed onto the wiring substrate 500, the probability that the semiconductor light-emitting devices 350 are separated from the transfer substrate 400 may increase due to the protrusions 510.

On the other hand, in order for the semiconductor light-emitting devices 350 disposed on the transfer substrate 400 to be transferred to the wiring substrate 500, surface energy between the semiconductor light-emitting devices 350 and the wiring substrate 500 should be higher than surface energy between the semiconductor light-emitting devices 350 and the transfer substrate 400. When there is a greater difference between the surface energy between the semiconductor light-emitting devices 350 and the wiring substrate 500 and the surface energy between the semiconductor light-emitting devices 350 and the transfer substrate 400, the probability that the semiconductor light-emitting devices 350 are separated from the transfer substrate 400 is more increased. Therefore, it is preferable that the difference between the two surface energies is great.

After all the semiconductor light-emitting devices 350 disposed on the transfer substrate 400 are transferred onto the wiring substrate 500, the step of establishing electrical connection between the semiconductor light-emitting devices 350 and wiring electrodes provided on the wiring substrate may be performed. The structure of the wiring electrodes and the method of establishing the electrical connection may vary depending on the type of the semiconductor light-emitting devices 350.

Although not shown, an anisotropic conductive film may be disposed on the wiring substrate 500. In this case, the electrical connection can be established between the semiconductor light-emitting devices 350 and the wiring electrodes formed on the wiring substrate 500, simply by pressing the transfer substrate 400 onto the wiring substrate 500.

On the other hand, when manufacturing a display device including semiconductor light-emitting devices emitting light of different colors, the method described in FIGS. 10A to 10C can be implemented in various ways. Hereinafter, a method for manufacturing a display device including semiconductor light-emitting devices that emit red (R), green (G), and blue (B) light will be described.

Figure 11:
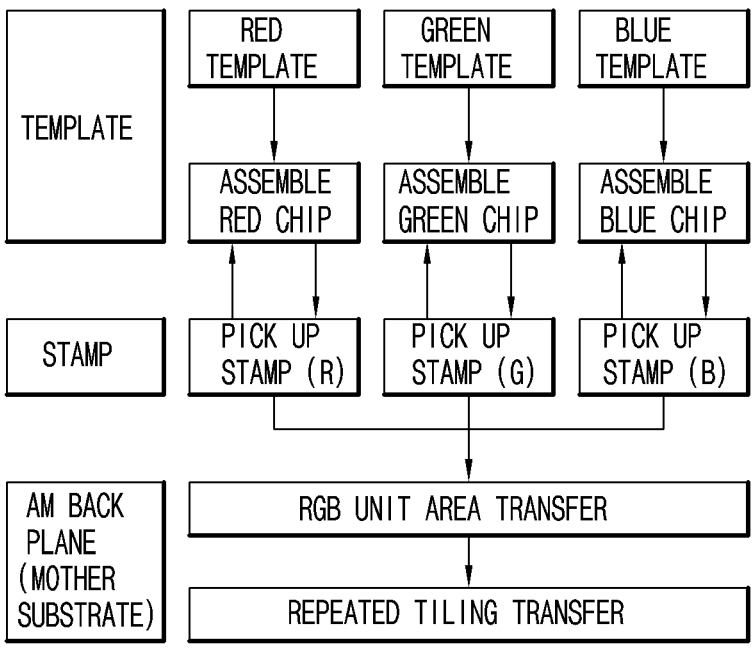
FIGS. 11 to 13 are flowcharts illustrating a method for manufacturing a display device including semiconductor light-emitting devices that emit red (R), green (G), and blue (B) light.
Figure 12:
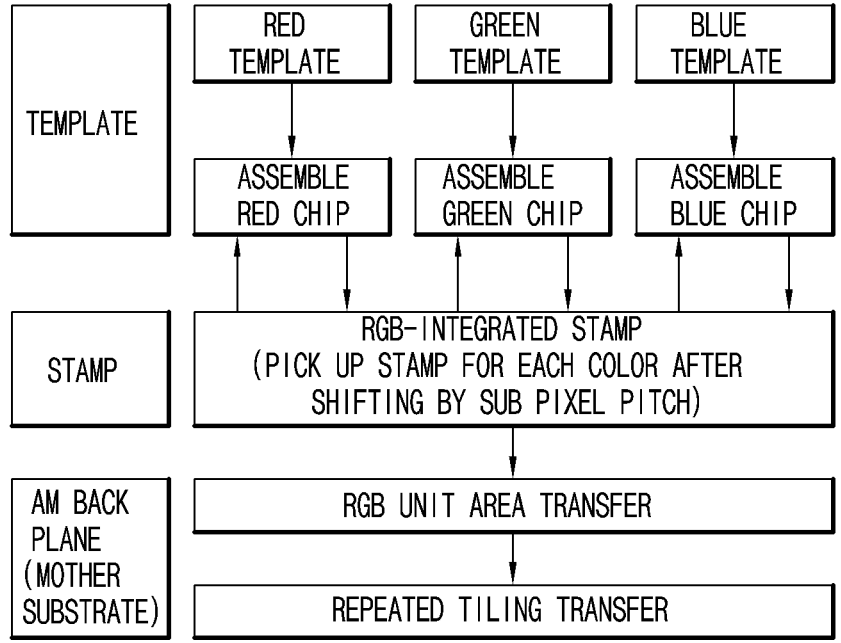
Figure 13:
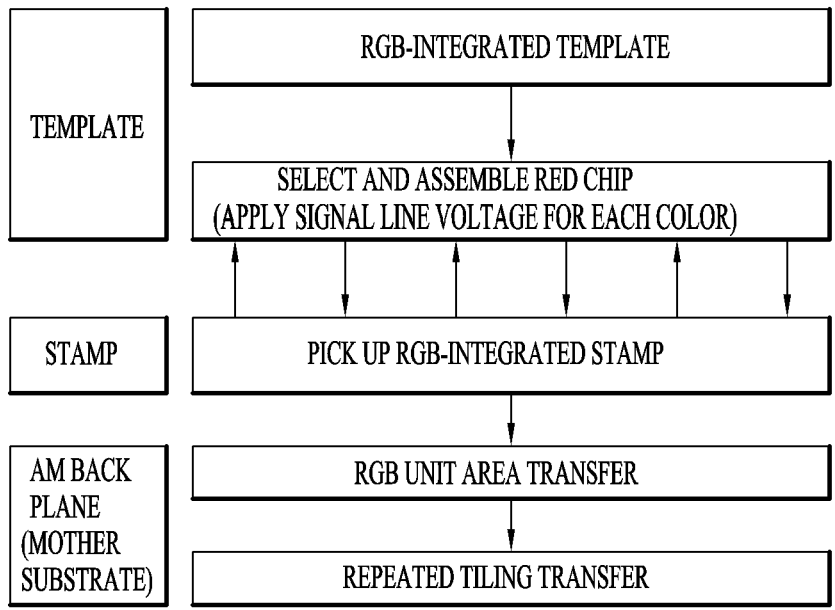

FIGS. 11 to 13 are flowcharts illustrating a method for manufacturing a display device including semiconductor light-emitting devices that emit red (R), green (G), and blue (B) light.

Semiconductor light-emitting devices emitting light of different colors may be individually assembled to different assembly substrates. Specifically, the assembly substrate 161 may include a first assembly substrate on which semiconductor light-emitting devices emitting light of a first color are mounted, a second assembly substrate on which semiconductor light-emitting devices emitting light of a second color different from the first color are mounted, and a third assembly substrate on which semiconductor light-emitting devices emitting light of a third color different from the first color and the second color are mounted. Different kinds of semiconductor light-emitting devices are assembled to assembly substrates, respectively, according to the method described in FIGS. 8A to 8E. For example, semiconductor light-emitting devices emitting red (R), green (G), and blue (B) light may be assembled to the first to third assemble substrates, respectively.

Referring to FIG. 11, a RED chip, a GREEN chip, and a BLUE chip may be assembled respectively to first to third assembly substrates RED TEMPLATE, GREEN TEMPLATE, and BLUE TEMPLATE. In this state, the RED chip, GREEN chip and BLUE chip may be transferred to the wiring substrate by different transfer substrates, respectively.

Specifically, the step of transferring the semiconductor light-emitting devices, which are mounted on the assembly substrate, to the wiring substrate may include pressing a first transfer substrate (stamp R) onto the first assembly substrate RED TEMPLATE to transfer the semiconductor light-emitting devices (RED chip) emitting the light of first color from the first assembly substrate RED TEMPLATE to the first transfer substrate (stamp R), pressing a second transfer substrate (stamp G) onto the second assembly substrate GREEN TEMPLATE to transfer semiconductor light-emitting devices (GREEN chip) emitting the light of second color from the second assembly substrate GREEN TEMPLATE to the second transfer substrate (stamp G), and pressing a third transfer substrate (stamp B) onto the third assembly substrate BLUE TEMPLATE to transfer semiconductor light-emitting devices (BLUE chip) emitting the light of third color from the third assembly substrate BLUE TEMPLATE to the third transfer substrate (stamp B).

Thereafter, the step of pressing the respective first to third transfer substrates onto the wiring substrate to transfer the semiconductor light-emitting devices emitting the light of first to third colors from the first to third transfer substrates to the wiring substrate, respectively.

According to the manufacturing method according to FIG. 11, three types of assembly substrates and three types of transfer substrates are required to manufacture a display device including a RED chip, a GREEN chip, and a BLUE chip.

On the contrary, referring to FIG. 12, the RED chip, the GREEN chip, and the BLUE chip may be assembled to the first to third assembly substrates RED TEMPLATE, GREEN TEMPLATE, and BLUE TEMPLATE, respectively. In this state, the RED chip, GREEN chip and BLUE chip may be transferred to the wiring substrate by the same transfer substrate.

Specifically, the step of transferring the semiconductor light-emitting devices, which are mounted on the assembly substrate, to the wiring substrate may include pressing a transfer substrate (RGB integrated stamp) onto the first assembly substrate RED TEMPLATE to transfer the semiconductor light-emitting devices (RED chip) emitting the light of first color from the first assembly substrate RED TEMPLATE to the transfer substrate (RGB integrated stamp), pressing the transfer substrate (RGB integrated stamp) onto the second assembly substrate GREEN TEM-PLATE to transfer semiconductor light-emitting devices (GREEN chip) emitting the light of second color from the second assembly substrate GREEN TEMPLATE to the transfer substrate (RGB integrated stamp), and pressing the transfer substrate (RGB integrated stamp) onto the third assembly substrate BLUE TEMPLATE to transfer semiconductor light-emitting devices (BLUE chip) emitting the light of third color from the third assembly substrate BLUE TEMPLATE to the transfer substrate (RGB integrated stamp).

In this case, the alignment positions between each of the first to third assembly substrates and the transfer substrate may be different from each other. For example, when the alignment between the assembly substrates and the transfer substrate is completed, the relative position of the transfer substrate with respect to the first assembly substrate and the relative position of the transfer substrate with respect to the second assembly substrate may be different from each other. The transfer substrate may be shifted in its alignment position by a pitch of a sub pixel every time the type of the assembly substrate is changed. In this way, when the transfer substrate is sequentially pressed onto the first to third assembly substrates, all the three kinds of chips can be transferred to the transfer substrate.

Afterwards, similar to FIG. 11, the step of pressing the transfer substrate onto the wiring substrate to transfer the semiconductor light-emitting devices emitting the light of first to third colors from the transfer substrate to the wiring substrate is performed.

According to the manufacturing method illustrated in FIG. 12, three types of assembly substrates and one type of transfer substrate are required to manufacture a display device including an RED chip, a GREEN chip, and a BLUE chip.

Unlike FIGS. 11 and 12, according to FIG. 13, a RED chip, a GREEN chip, and a BLUE chip may be assembled onto one assembly substrate (RGB integrated TEMPLATE). In this state, each of the RED chip, GREEN chip and BLUE chip can be transferred to the wiring substrate by the same transfer substrate (RGB integrated stamp).

According to the manufacturing method illustrated in FIG. 13, one type of assembly substrate and one type of transfer substrate are required to manufacture a display device including an RED chip, a GREEN chip, and a BLUE chip.

As described above, when manufacturing a display device including semiconductor light-emitting devices emitting light of different colors, the manufacturing method may be implemented in various ways.

The present disclosure proposes a display device including semiconductor light-emitting devices emitting different colors of light and a method for manufacturing the same. The display device according to the present disclosure is manufactured in a hybrid method in which semiconductor light-emitting devices assembled on an assembly substrate are finally transferred to a wiring substrate (or wiring board) through a transfer substrate, and the present disclosure provides a method for improving alignment precision in an alignment process between substrates.

Figure 14:
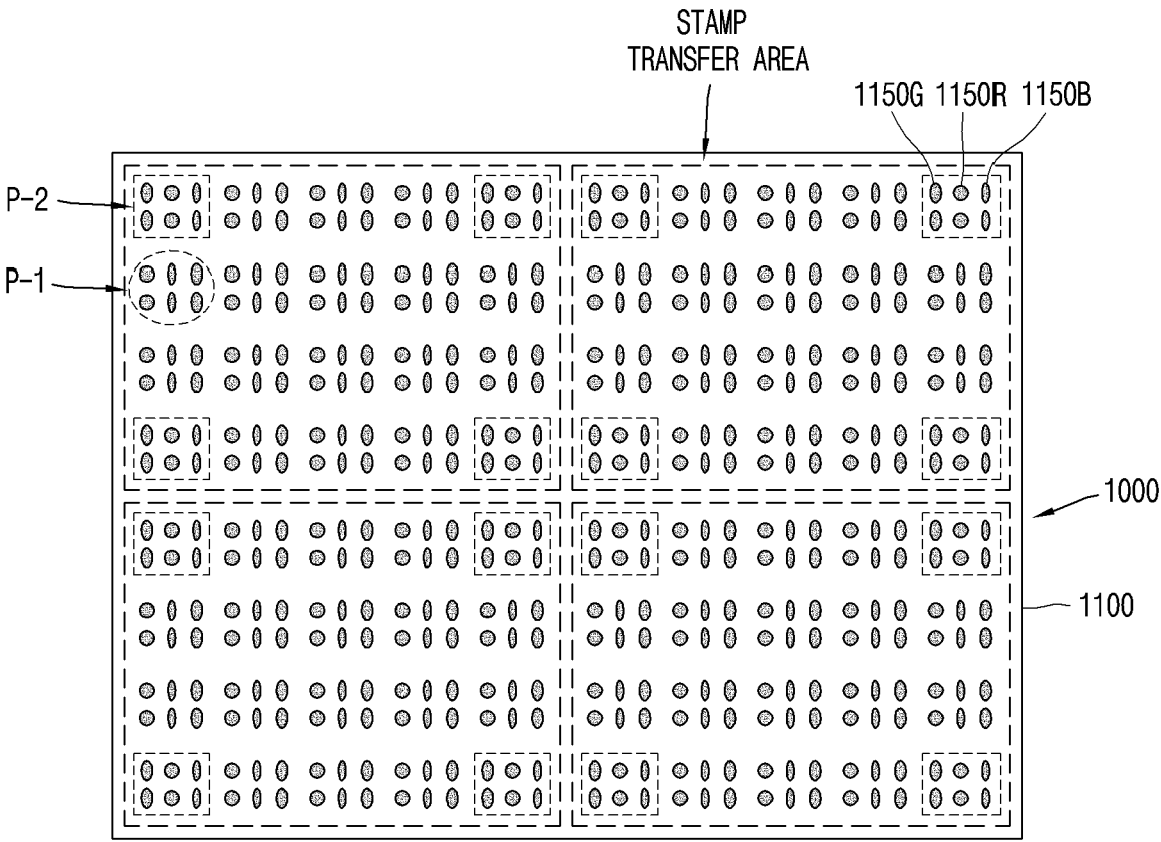
FIG. 14 is a view illustrating a portion of a display device in accordance with one embodiment of the present disclosure.
Figure 15:
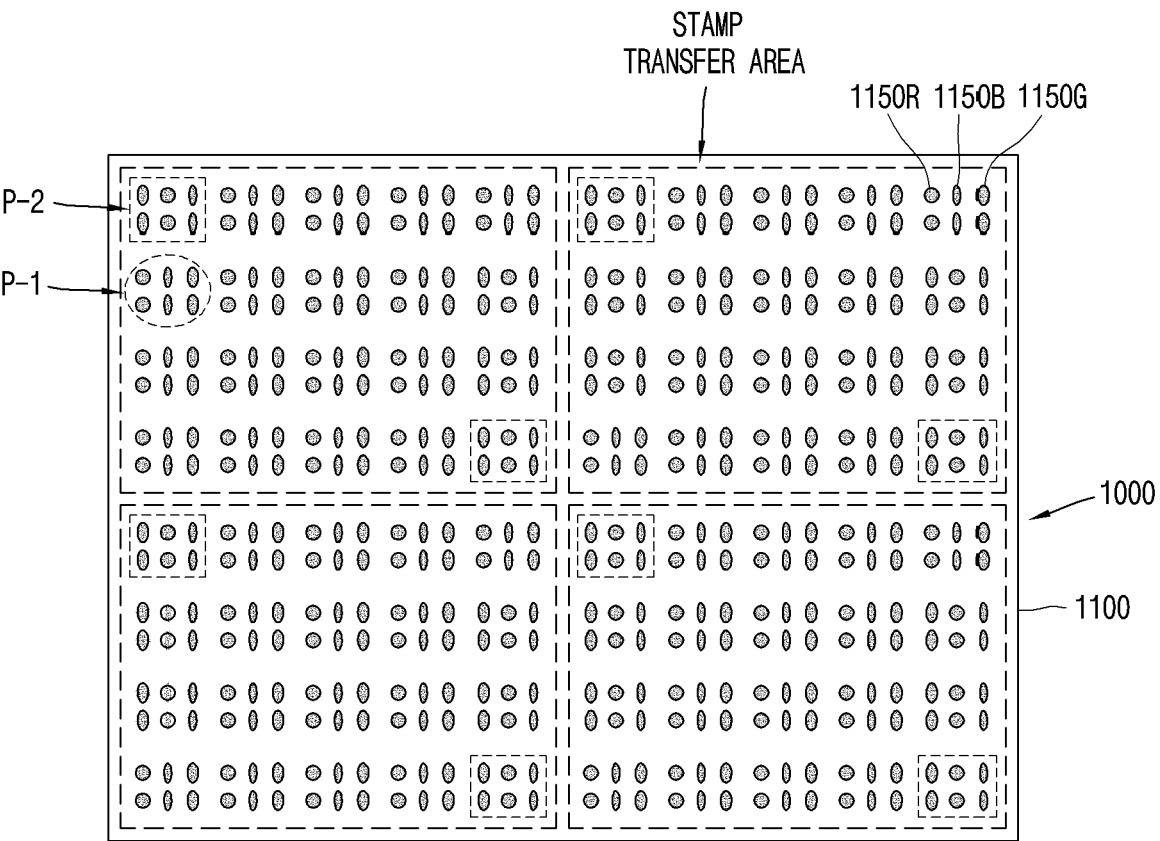
FIGS. 15 and 16 are views illustrating a portion of a display device in accordance with another embodiment of the present disclosure.
Figure 16:
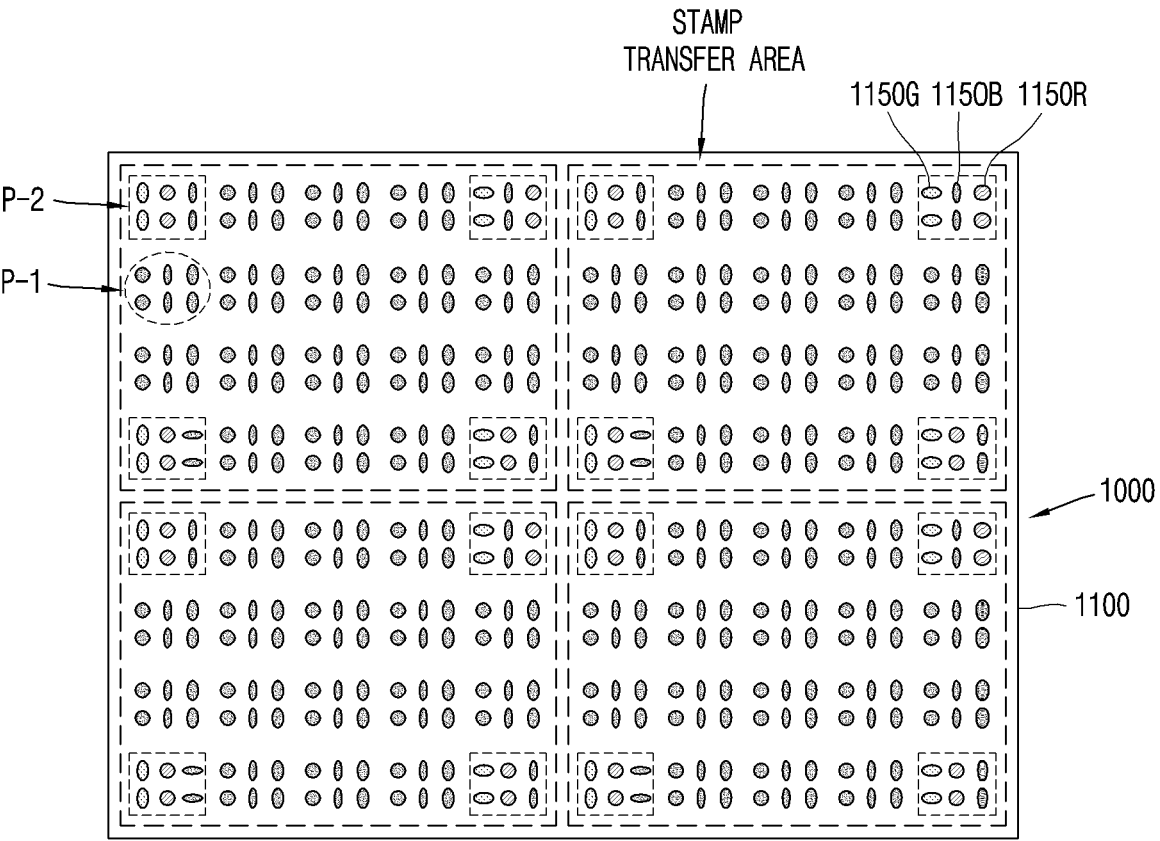

Hereinafter, a display device according to the present disclosure will be described with reference to FIGS. 14 to 16. FIG. 14 is a view illustrating a portion of a display device in accordance with one embodiment of the present disclosure, and FIGS. 15 and 16 are views illustrating a portion of a display device in accordance with another embodiment of the present disclosure.

A display device 1000 according to the present disclosure includes a wiring substrate 1100 and semiconductor light-emitting devices 1150. The wiring substrate 1100 may be made of glass or a polymer material. The wiring substrate 1100 may include thin film transistors (TFTs) involved in driving the semiconductor light-emitting devices 1150, specifically, a switching thin film transistor and a driving thin film transistor. The thin film transistors TFT are disposed to correspond to the semiconductor light-emitting devices 1150 in a one-to-one manner, and may perform control in units of individual semiconductor light-emitting devices 1150. In addition, the wiring substrate 1100 may include gate electrodes and data electrodes configured as a plurality of lines for electrical connection between the thin film transistors TFT and the semiconductor light emitting devices 1150. An individual electrode and a common electrode may be disposed to apply driving power to each semiconductor light emitting device 1150. In the present disclosure, a detailed description of components basically disposed on the wiring substrate 1100 will be omitted.

Meanwhile, the wiring substrate 1100 may include a plurality of pixel areas P in which the semiconductor light-emitting devices 1150 are disposed. The semiconductor light-emitting devices 1150 disposed in the pixel area P may become sub-pixels SP. According to an embodiment of the present disclosure, one pixel area P may include two or more semiconductor light-emitting devices 1150 having different shapes while emitting different colors of light as sub-pixels SP.

Preferably, the pixel area P may include, as sub-pixels SP, a first semiconductor light-emitting device 1150B emitting blue light and having a first shape, a second semiconductor light-emitting device 1150G emitting green light and having a second shape, and a third semiconductor light-emitting device 1150R emitting red light and having a third shape. The first semiconductor light-emitting device 1150B, the second semiconductor light-emitting device 1150G, and the third semiconductor light-emitting device 1150R may be disposed in a line within the pixel area P. In addition, the pixel area P may further include first to third semiconductor light-emitting devices for redundancy. The first to third semiconductor light-emitting devices for redundancy may be disposed within the same pixel area P in the same arrangement as the first to third semiconductor light-emitting devices 1150B, 1150G, and 1150R, which are the sub-pixels SP, while forming a plurality of rows and columns.

Hereinafter, an embodiment in which the first semiconductor light-emitting device 1150B, the second semiconductor light-emitting device 1150G, and the third semiconductor light-emitting device 1150R are provided as sub-pixels SP in the pixel area P will be mainly described.

According to the present disclosure, the wiring substrate 1100 may include two or more pixel areas P-1 and P-2 in which the semiconductor light-emitting devices 1150 are arranged differently, as illustrated in FIGS. 14 to 16. In the present disclosure, some pixel areas P-2 in which the semiconductor light-emitting devices 1150, that is, the sub-pixels SP are disposed differently. The pixel areas P-2 may serve as alignment keys when manufacturing the display device 1000.

In the present disclosure, a plurality of pixel areas P may be arranged in a matrix configuration on the wiring substrate 1100. The pixel areas P may include a first pixel area P-1 and a second pixel area P-2. In the first pixel area P-1, the first to third semiconductor light-emitting devices 1150B, 1150G, and 1150R may be disposed to have a first arrangement. In the second pixel area P-2, the first to third semiconductor light-emitting devices 1150B, 1150G, and 1150R may be disposed in an arrangement different from the first arrangement. In other words, any pixel area having a different arrangement from the first pixel area P-1 may become the second pixel area P-2. The arrangement in the second pixel area P-2 may be different from the first arrangement in at least one of an arrangement order and an arrangement direction of the first to third semiconductor light-emitting devices 1150B, 1150G, and 1150R. According to the present disclosure, the first pixel areas P-1 may be disposed more than the second pixel areas P-2 on the wiring substrate 1100. The second pixel areas P-2 may be used as alignment keys for precise alignment between substrates when manufacturing the display device 1000.

Hereinafter, various exemplary embodiments of the first pixel area P-1 and the second pixel area P-2 will be described with reference to the accompanying drawings.

According to the present disclosure, as illustrated in the accompanying drawings, the pixel area P includes first and second semiconductor light-emitting devices 1150B and 1150G having different oval shapes and a third semiconductor light-emitting device 1150R having a circular shape. However, the shapes of the first to third semiconductor light-emitting devices 1150B, 1150G, and 1150R are not limited thereto.

In an exemplary embodiment, the arrangement order of the first to third semiconductor light-emitting devices 1150B, 1150G, and 1150R may be different in the first pixel area P-1 and the second pixel area P-2. Referring to FIGS. 14 and 15, the first pixel area P-1 may have an arrangement order of the third semiconductor light-emitting device 1150R, the first semiconductor light-emitting device 1150B, and the second semiconductor light-emitting device 1150G. The second pixel area P-2 may have an arrangement order of the second semiconductor light-emitting device 1150G, the third semiconductor light-emitting device 1150R, and the first semiconductor light-emitting device 1150B. In this case, the arrangement of the semiconductor light-emitting devices of all the second pixel areas P-2 disposed on the wiring substrate 1100 may be the same.

In another embodiment, the arrangement order and direction of the first to third semiconductor light-emitting devices 1150B, 1150G, and 1150R may be different in the first pixel area P-1 and the second pixel area P-2. Referring to FIG. 16, the first pixel area P-1 may have an arrangement order of the third semiconductor light-emitting device 1150R, the first semiconductor light-emitting device 1150B, and the second semiconductor light-emitting device 1150G. The second pixel area P-2 may have an arrangement order of the second semiconductor light-emitting device 1150G, the third semiconductor light-emitting device 1150R, and the first semiconductor light-emitting device 1150B, or an arrangement order of the second semiconductor light-emitting device 1150G, the first semiconductor light-emitting device 1150B, and the third semiconductor light-emitting device 1150B.

In addition, the first and second semiconductor light-emitting devices 1150B and 1150G having the elliptical shapes in some of the second pixel areas P-2 may be different in arrangement direction from the first and second semiconductor light-emitting devices 1150B and 1150G disposed in the first pixel area P-1. For example, the first and second semiconductor light-emitting devices 1150B and 1150G in some of the second pixel areas P-2 may be arranged in a rotated state of 90 degrees compared with the first and second semiconductor light emitting devices 1150B and 1150G of the first pixel area P-1.

Meanwhile, referring to FIG. 16, the arrangement of the semiconductor light emitting devices in some of the second pixel areas P-2 disposed on the wiring substrate 1100 may be the same. That is, the wiring substrate 1100 may include second pixel areas P-2 having different arrangements. In this case, the second pixel areas P-2 having the same arrangement may be repeatedly disposed for each predetermined unit.

According to the present disclosure, the display device 1000 may be manufactured through a process of transferring the semiconductor light-emitting devices transferred to a transfer substrate onto the wiring substrate 1100, which is performed a plurality of times (tiling transfer). In FIGS. 14 to 16, an area A may be a one-time transfer area by the transfer substrate.

Referring to the drawing, most of the pixel areas included in the wiring substrate 1100 may correspond to the first pixel areas P-1, and some pixel areas may correspond to the second pixel areas P-2. At this time, at least some of the pixel areas disposed at portions adjacent to corners of the wiring substrate 1100 may be the second pixel areas P-2. The semiconductor light-emitting devices having the arrangement of the second pixel areas P-2 used as the alignment keys are disposed at positions adjacent to at least two or more corners of the transfer substrate. This is because the corners of the wiring substrate 1100 are aligned with corners of the transfer substrate. Accordingly, depending on a position at which the semiconductor light-emitting devices having the arrangement of the second pixel area P-2 are disposed on the transfer substrate, some or all of those pixel areas located in the vicinity of the corners of the wiring substrate 1100 may be the second pixel areas P-2.

For example, as illustrated in FIGS. 14 and 16, when the semiconductor light-emitting devices having the arrangement of the second pixel area P-2 are disposed in the vicinity of four corners of the transfer substrate, all of the pixel areas adjacent to the corners of the wiring substrate 1100 may be the second pixel areas P-2. On the other hand, as illustrated in FIG. 15, when the semiconductor light-emitting devices having the arrangement of the second pixel area P-2 are disposed adjacent to two corners among the four corners of the transfer substrate, only some of the pixel areas adjacent to the corners of the wiring substrate 1100 may be the second pixel areas P-2. However, the positions where the semiconductor light-emitting devices having the arrangement of the second pixel area P-2 are disposed are not limited thereto, and an embodiment in which such semiconductor light-emitting devices are disposed at two or three corners different from the corners illustrated in the drawings may also be applied.

In addition, depending on the position at which the semiconductor light-emitting devices having the arrangement of the second pixel area P-2 are disposed on the transfer substrate, the second pixel areas P-2 may be discontinuously disposed on the wiring substrate 1100 or some of the second pixel areas P-2 may be continuously disposed on the wiring substrate 1100.

For example, as illustrated in FIGS. 14 and 16, when the semiconductor light-emitting devices having the arrangement of the second pixel area P-2 are disposed adjacent to the four corners of the transfer substrate, some of the second pixel areas P-2 disposed on the wiring substrate 1100 may be continuously disposed along at least one of a row direction and a column direction. On the other hand, as illustrated in FIG. 15, when the semiconductor light-emitting devices having the arrangement of the second pixel area P-2 are disposed adjacent to two corners, specifically, an upper left portion and a lower right portion among the four corners of the transfer substrate, the second pixel areas P-2 may be discontinuously disposed on the wiring substrate 1100.

Figure 17:
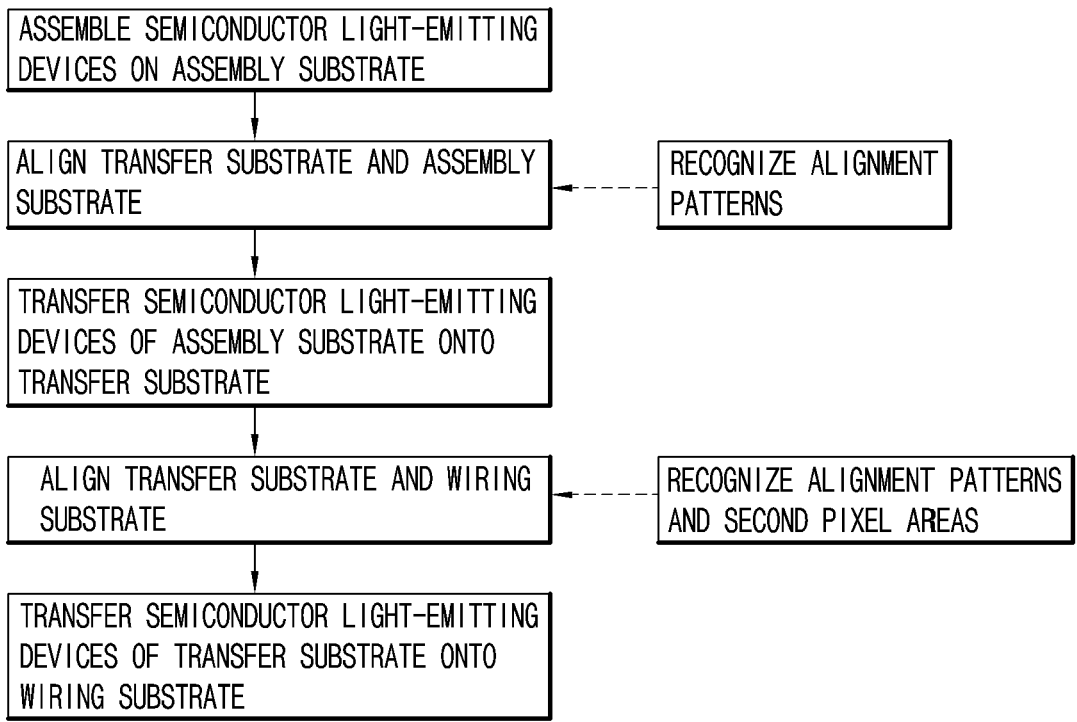
FIG. 17 is a flowchart illustrating a method for manufacturing a display device in accordance with the present disclosure.
Figure 18A:
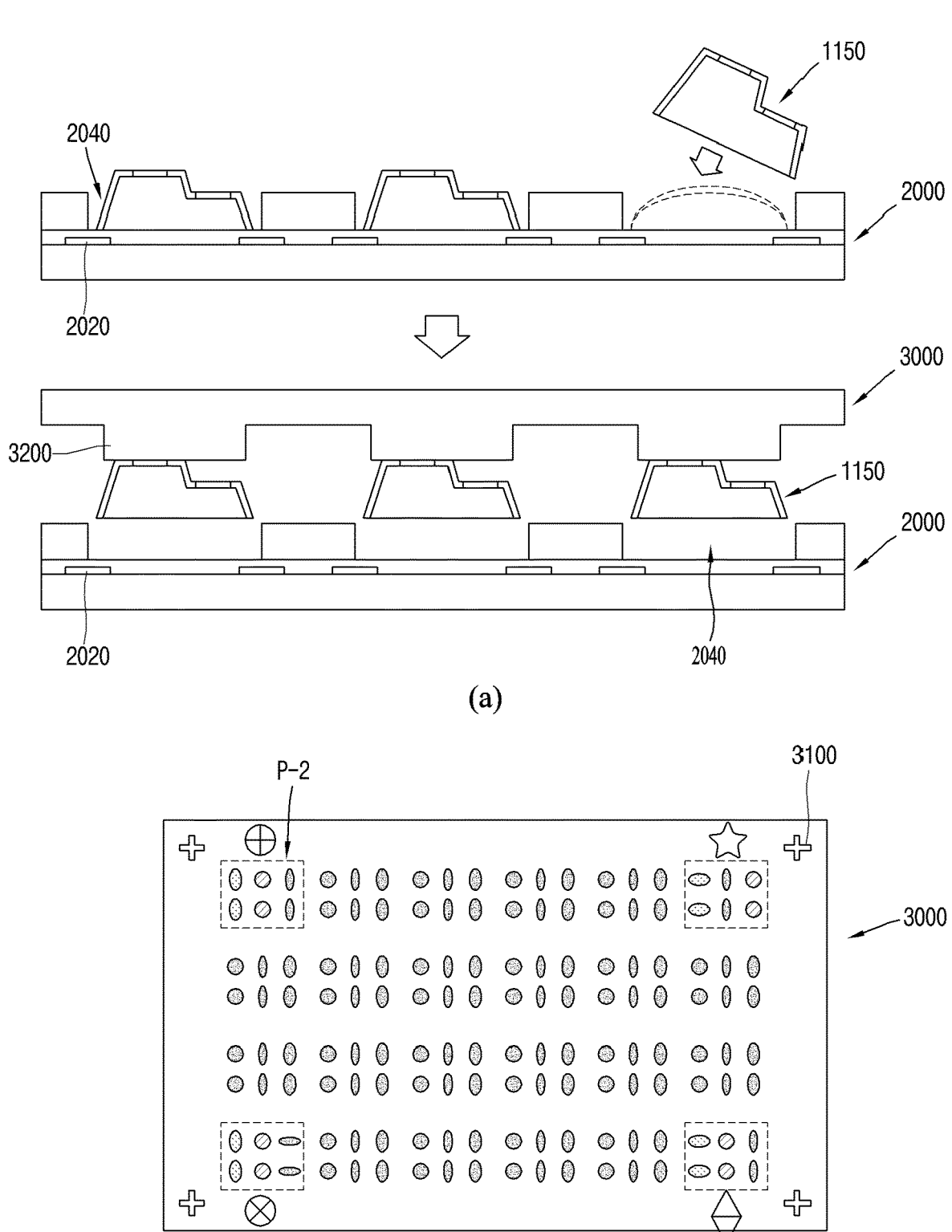
FIGS. 18A and 18B are conceptual views illustrating a transfer process in a method for manufacturing a display device in accordance with the present disclosure.
Figure 18B:
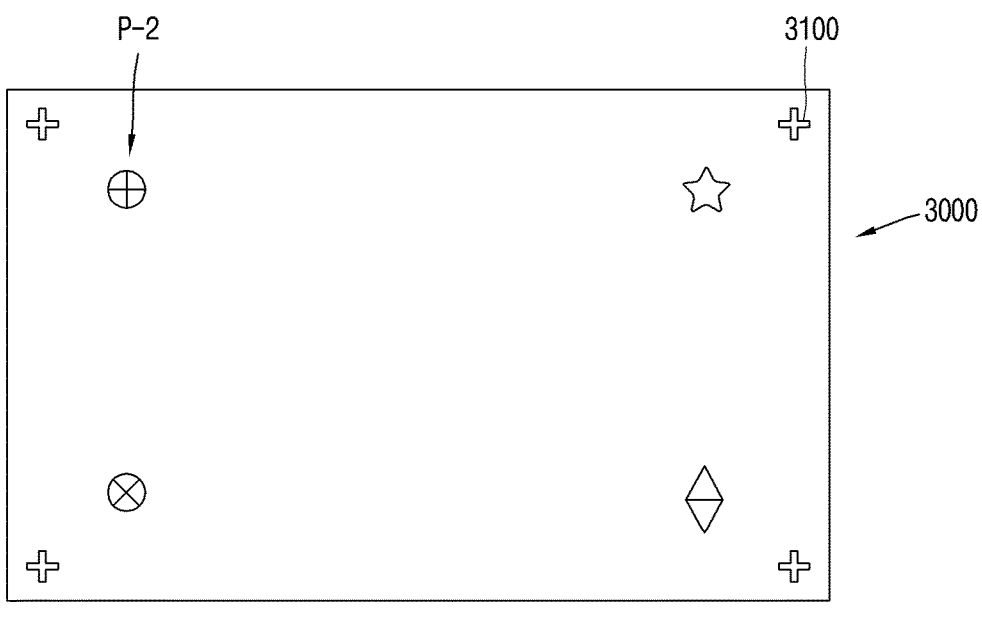
Figure 18B:
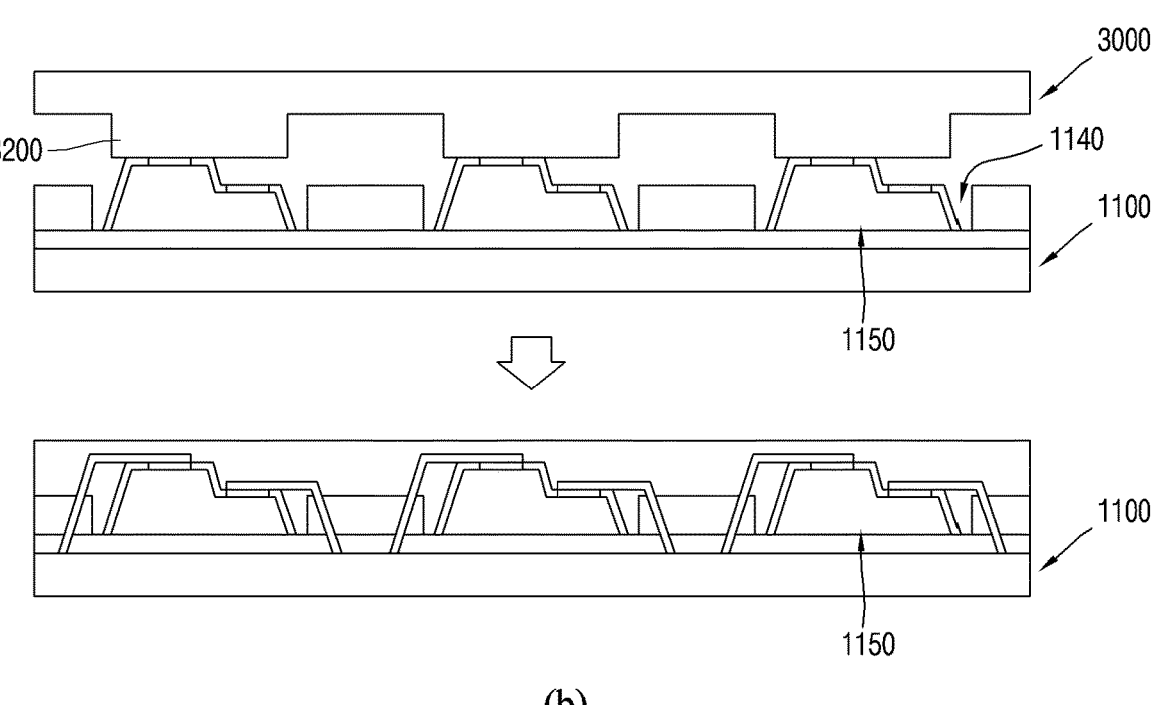
Figure 19:
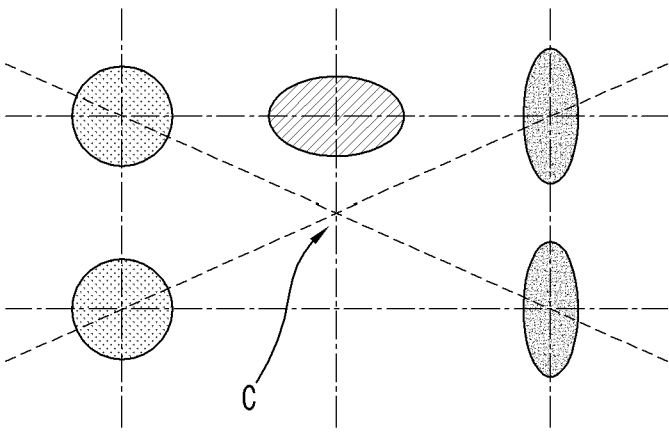
FIG. 19 is a conceptual view illustrating alignment of a transfer substrate and a wiring substrate in a method for manufacturing a display device in accordance with the present disclosure.

Hereinafter, a method for manufacturing the display device 1000 will be described. FIG. 17 is a flowchart illustrating a method for manufacturing a display device in accordance with the present disclosure, FIGS. 18A and 18B are conceptual views illustrating a transfer process in a method for manufacturing a display device in accordance with the present disclosure, and FIG. 19 is a conceptual view illustrating an alignment of a transfer substrate and a wiring substrate in a method for manufacturing a display device in accordance with the present disclosure.

In the present disclosure, the display device 1000 may include semiconductor light-emitting devices 1150 having different shapes while emitting different colors of light in the pixel area P. The method for manufacturing the display device 1000 according to the present disclosure may include assembling semiconductor light-emitting devices 1150 on an assembly substrate 2000 (S100), transferring the semiconductor light-emitting devices 1150 assembled on the assembly substrate 2000 to a transfer substrate 3000 (S200), and transferring the semiconductor light-emitting devices 1150 transferred to the transfer substrate 3000 to a wiring substrate 1100 (S300).

The step of assembling the semiconductor light-emitting devices 1150 on the assembly substrate 2000 (hereinafter, referred to as a self-assembly step) (S100) may be performed using the self-assembly device illustrated in FIG. 6, and may include those processes according to FIGS. 8A to 8E. That is, the self-assembly step (S100) may indicate a step of self-assembling the semiconductor light-emitting devices 1150 in a fluid onto the assembly substrate 2000 using an electric field and a magnetic field. The self-assembly step (S100) may include dispersing the semiconductor light-emitting devices 1150 in a chamber containing an assembly solution, arranging the assembly substrate 2000 at an assembly position, moving the semiconductor light-emitting devices 1150 within the chamber by applying a magnetic field, and seating the semiconductor light-emitting devices 1150 on the assembly substrate 2000 by forming an electric field.

According to the present disclosure, two or more semiconductor light-emitting devices 1150 having different shapes while emitting different colors of light may be dispersed in the chamber. Preferably, a first semiconductor light-emitting device 1150B having a first shape while emitting blue light, a second semiconductor light-emitting device 1150G having a second shape while emitting green light, and a third semiconductor light emitting device 1150R having a third shape while emitting red light may be included. For example, as illustrated in the drawing, the first and second semiconductor light-emitting devices 1150B and 1150G may have different oval shapes, and the third semiconductor light-emitting device 1150R may have a circular shape. As such, since the first to third semiconductor light-emitting devices 1150B, 1150G, and 1150R are formed in the different shapes, simultaneous assembly through the self-assembly may be enabled. According to the present disclosure, two or more types of semiconductor light-emitting devices may be assembled on the assembly substrate, but hereinafter, an embodiment in which the first to third semiconductor light-emitting devices 1150B, 1150G, and 1150R are assembled will be described.

In detailed steps, an assembly position may be an upper side of the chamber. More specifically, the assembly position may indicate a position at which an assembly surface on which the semiconductor light-emitting devices 1150 are seated is immersed in a solution in a state of facing a bottom surface of the chamber at the upper side of the chamber. The assembly surface may include assembly electrodes 2020 for forming an electric field and cells 2040 on which the semiconductor light-emitting devices 1150 are seated. The cells 2040 may be formed in shapes corresponding to the semiconductor light-emitting devices 1150, and for example, may be formed in shapes corresponding to shapes of the first to third semiconductor light-emitting devices 1150B, 1150G, and 1150R (hereinafter, referred to as first to third cells).

The assembly substrate 2000 may include a plurality of pixel areas P arranged in a matrix configuration. The pixel area P of the assembly substrate 2000 includes first to third cells 2040B, 2040G, and 2040R, and the first to third semiconductor light-emitting devices 11501B, 1150G, and 1150R may be seated in the respective cells through self-assembly.

According to the present disclosure, the assembly substrate 2000 may include a first pixel area P-1 in which the first to third cells 2040B, 2040G, and 2040R or the first to third semiconductor light-emitting devices 1150B, 1150G, and 1150R after self-assembly have a first arrangement, and a second pixel area P-2 in which the first to third cells 2040B, 2040G, and 2040R or the first to third semiconductor light-emitting devices 1150B, 1150G, and 1150R after self-assembly have an arrangement different from the first arrangement. That is, according to the present disclosure, the assembly substrate 2000 may include two or more pixel areas in which the semiconductor light-emitting devices 1150 are arranged differently. In this case, the second pixel area P-2 may correspond to a second alignment pattern to be described later. On the other hand, the pixel area P may further include first to third semiconductor light-emitting devices for redundancy.

Also, in detailed steps, a magnet array may be disposed on a top of the assembly substrate 2000 to move the semiconductor light-emitting devices 1150, and an electric field may be formed by applying a voltage to the assembly electrodes 2020.

Meanwhile, when the self-assembly step (S100) is completed, the step of transferring the semiconductor light-emitting devices 1150 assembled on the assembly substrate 2000 to the transfer substrate 3000 (hereinafter, referred to as a primary transfer step) (S200) may be performed. Specifically, the primary transfer step (S200) may include aligning the assembly substrate 2000 and the transfer substrate 3000, and bonding the assembly substrate 2000 and the transfer substrate 3000 together. In the primary transfer step (S200), the alignment and the bonding may be performed by adjusting a position of the transfer substrate 3000, in detail, by adjusting a position of a head supporting the transfer substrate 3000.

The transfer substrate 3000 may be a substrate made of an adhesive and flexible material, for example, polydimethylsiloxane (PDMS), or may be a substrate made of other materials.

The step of aligning the assembly substrate 2000 and the transfer substrate 3000 may be performed through alignment patterns 3100. Hereinafter, the alignment patterns 3100 used for aligning the assembly substrate 2000 and the transfer substrate 3000 are referred to as first alignment patterns. According to the present disclosure, the assembly substrate 2000 and the transfer substrate 3000 may include the first alignment patterns 3100 for alignment. The transfer substrate 3000 may include the first alignment patterns 3100 disposed adjacent to respective corners thereof, and the assembly substrate 2000 may include the first alignment patterns disposed adjacent to respective corners thereof to correspond to the first alignment patterns 3100 on the transfer substrate 3000. For example, since the assembly substrate 2000 has a larger area than the transfer substrate 3000, the process of transferring the semiconductor light-emitting devices 1150 assembled on the assembly substrate 2000 to the transfer substrate 3000 may be repeatedly performed a plurality of times (tiling transfer). Therefore, the assembly substrate 2000 may include the first alignment patterns at positions to be aligned with the vicinity of the corners of the transfer substrate 3000. In one embodiment, the first alignment patterns 3100 each may have a concavo-convex structure, and may have various other forms.

In addition, the first alignment patterns formed on the assembly substrate 2000 may be made of the same material as the assembly substrate 2000, and the first alignment patterns 3100 formed on the transfer substrate 3000 may be made of the same material as the transfer substrate 3000. Accordingly, the first alignment patterns of the assembly substrate may be made of a polyimide (PI) material, and the first alignment patterns 3100 of the transfer substrate may be made of a polydimethylsiloxane (PDMS) material.

In summary, the step of aligning the assembly substrate 2000 and the transfer substrate 3000 may include a process of aligning the transfer substrate 3000 on one side of the assembly substrate 2000 such that the first alignment patterns 3100 overlap each other after recognizing the first alignment patterns 3100 formed respectively on the assembly substrate 2000 and the transfer substrate 3000.

Meanwhile, the transfer substrate 3000 may include protrusions 3200 formed on portions overlapping the semiconductor light-emitting devices 1150 of the assembly substrate 2000 when the assembly substrate 2000 and the transfer substrate 3000 are aligned with each other. That is, the transfer substrate 3000 may include a plurality of protrusions 3200 disposed at predetermined intervals. The plurality of protrusions 3200 may be made of the same PDMS material as that of the transfer substrate 3000 and protrude from one surface of the transfer substrate 3000 so as to increase an adhesive property with the semiconductor light-emitting devices 1150 when the transfer substrate 3000 is bonded to the assembly substrate 2000. In addition, as illustrated in (a) of FIG. 18A, since the plurality of protrusions 3000 are formed to have a cross-sectional area larger than those of the semiconductor light-emitting devices 1150, it is possible to respond to deviations in position accuracy.

Next, when the primary transfer step (S200) is completed, the step of transferring the semiconductor light-emitting devices 1150 transferred to the transfer substrate 3000 to the wiring substrate 1100 (hereinafter, referred to as a secondary transfer step) (S300) may be performed. Specifically, the secondary transfer step (S300) may include aligning the transfer substrate 3000 and the wiring substrate 1100, and bonding the transfer substrate 3000 and the wiring substrate 1100 together. In the secondary transfer step (S300), the alignment and the bonding may be performed by adjusting a position of the transfer substrate 3000. In detail, the alignment and the bonding may be performed by adjusting a position of a head supporting the transfer substrate 3000.

The step of aligning the transfer substrate 3000 and the wiring substrate 1100 may be performed through first and second alignment patterns. According to the present disclosure, the transfer substrate 3000 and the wiring substrate 1100 may include first alignment patterns 3100 and second alignment patterns for alignment. First, as described above, the transfer substrate 3000 may include the first alignment patterns 3100 adjacent to the respective corners, and the description of the first alignment patterns 3100 of the transfer substrate 3000 will be replaced with the previous description. The wiring substrate 1100 may include first alignment patterns including portions adjacent to the respective corners and disposed at positions corresponding to the first alignment patterns 3100 on the transfer substrate 3000. For example, since the wiring substrate 2000 has a larger area than the transfer substrate 3000, the process of transferring the semiconductor light-emitting devices 1150 transferred to the transfer substrate 3000 to the wiring substrate 1100 may be repeatedly performed a plurality of times (tiling transfer). Therefore, the wiring substrate 1100 may include the first alignment patterns at positions to be aligned with the vicinity of the corners of the transfer substrate 3000. Also, the first alignment patterns formed on the wiring substrate 1100 may be made of the same material as that of the wiring substrate 1100, for example, a PI material.

Meanwhile, in the process of manufacturing the display device 1000, a problem occurs that the first alignment patterns 3100 formed on the transfer substrate 3000 are deformed through the bonding with the assembly substrate 2000 and the wiring substrate 1100 which is performed a plurality of times. Specifically, since the first alignment patterns 3100 are formed of an adhesive and flexible material, for example, a PDMS material, the first alignment patterns 3100 may be stretched and deformed during the repeated transfer processes due to the physical properties of the material. This may lower position precision.

To compensate for this, the present disclosure may further utilize the second alignment patterns in the secondary transfer step (S300). In the present disclosure, the second pixel area P-2 may be the second alignment pattern. Specifically, the assembly substrate 2000 may include the first pixel area P-1 and the second pixel area P-2. Thus, the transfer substrate 3000 may include semiconductor light-emitting devices 1150 transferred in an arrangement corresponding to the arrangement of the first pixel area P-1, and semiconductor light-emitting devices 1150 transferred in an arrangement corresponding to the arrangement of the second pixel area P-2.

Furthermore, according to the present disclosure, the transfer substrate 3000 may include the semiconductor light-emitting devices 1150 transferred in the arrangement corresponding to the arrangement of the second pixel area P-2 in the vicinity of at least two corners. That is, the transfer substrate 3000 may include the semiconductor light-emitting devices 1150 constituting the second pixel area P-2 at a position adjacent to the first alignment pattern 3100.

According to the present disclosure, the secondary transfer step (S300) may further include aligning the transfer substrate 3000 and the wiring substrate 1100 to overlap the first alignment patterns 3100 with each other by recognizing the first alignment patterns 3100 of the transfer substrate 3000 and the wiring substrate 1100 in the same way as the primary transfer step (S200), and thereafter recognizing semiconductor light-emitting devices 1150 having the arrangement of the second alignment pattern, namely, the second pixel area P-2 on the transfer substrate 3000 so as to precisely align the recognized semiconductor light-emitting devices 1150 on one side of the wiring substrate 1100. The process of recognizing the second alignment pattern may be performed in the vicinity of the first alignment pattern 3100, and a process of calculating a center point C by recognizing an image of the second alignment pattern may be performed. At this time, even when some of the semiconductor light-emitting devices 1150 to constitute the second pixel area P-2 serving as the second alignment pattern are not assembled, the center point C may be calculated.

After recognizing the second alignment pattern, the transfer substrate 3000 may be aligned on one side of the wiring substrate 1100 such that the second alignment pattern overlaps the second pixel area P-2 on the wiring substrate 1100. The wiring substrate 1100 may include accommodating grooves 1140 in which the semiconductor light-emitting devices 1150 are accommodated. The accommodating grooves that are disposed in an area that overlaps the semiconductor light-emitting devices 150 transferred in the vicinity of the corners of the transfer substrate 3000 may become the second pixel area P-2 after the transfer of the semiconductor light emitting devices 1150.

In summary, the step of aligning the transfer substrate 3000 and the wiring substrate 1100 may include the process of recognizing the first alignment patterns 3100 formed on the transfer substrate 3000 and the wiring substrate 1100 and aligning the transfer substrate 3000 on one side of the wiring substrate such that the first alignment patterns 3100 overlap each other, and a process of recognizing the second alignment patterns in the vicinity of the first alignment patterns 3100 to precisely align the wiring substrate 1100 and the transfer substrate 3000.

As described above, since the present disclosure can align the semiconductor light-emitting devices 1150 and the accommodation groove 1140 through the second alignment pattern, even if the first alignment pattern 3100 is deformed, the semiconductor light emitting devices 1150 can be precisely transferred on preset positions of the wiring substrate 1100.

When the secondary transfer step (S300) is completed, a step of electrically connecting the semiconductor light-emitting devices 1150 transferred to the wiring substrate 1100 and the wiring substrate 1100 may be further performed, and the display device 1000 may be completely manufactured.

The foregoing description is merely illustrative to explain the technical idea of the present disclosure, and it will be apparent to those skilled in the art that various modifications and variations can be made without departing from the essential characteristics of the present disclosure.

Therefore, the embodiments disclosed in the present disclosure are not intended to limit the technical spirit of the present disclosure, but to explain, and the scope of the technical spirit of the present disclosure is not limited by these embodiments.

The scope of the present disclosure should be construed according to the claims below, and all technical ideas within the scope equivalent thereto should be construed as being included in the scope of the present disclosure.

The invention claimed is:

1. A display device comprising:

a wiring substrate including a plurality of pixel areas; and semiconductor light-emitting devices disposed in each of the pixel areas, wherein each of the pixel areas includes semiconductor light-emitting devices having different shapes while emitting different colors of light, and the wiring substrate includes two or more pixel areas having a different arrangement of the semiconductor light-emitting devices, wherein the pixel area includes a first semiconductor light-emitting device emitting blue light and having a first shape, a second semiconductor light-emitting device emitting green light and having a second shape, and a third semiconductor light-emitting device emitting red light and having a third shape, wherein the pixel areas comprise:

a first pixel area disposed on the wiring substrate in a matrix configuration, and including the first to third semiconductor light-emitting devices having a first arrangement; and a second pixel area including the first to third semiconductor light emitting devices having an arrangement different from the first arrangement, and wherein the wiring substrate includes the first pixel areas more than the second pixel areas.

2. The display device of claim 1, wherein at least some of the pixel areas disposed on portions adjacent to corners of the wiring substrate are the second pixel areas.

3. The display device of claim 2, wherein the second pixel areas are discontinuously disposed on the wiring substrate.

4. The display device of claim 2, wherein some of the second pixel areas are continuously disposed along at least one of a row direction and a column direction.

5. The display device of claim 1, wherein the second pixel area is configured such that at least one of an arrangement order and an arrangement direction of the first to third semiconductor light-emitting devices is different from that of the first arrangement.

6. The display device of claim 1, wherein the arrangement of the first to third semiconductor light-emitting devices is the same in all the second pixel areas disposed on the wiring substrate.

7. The display device of claim 1, wherein the arrangement of the first to third semiconductor light-emitting devices is the same in some of the second pixel areas disposed on the wiring substrate.

8. The display device of claim 1, wherein the pixel area further includes redundant first to third semiconductor light-emitting devices.

9. A method for manufacturing a display device including semiconductor light-emitting devices having different shapes while emitting different colors of light in pixel areas, the method comprising:

assembling semiconductor light-emitting devices on an assembly substrate;

transferring the semiconductor light-emitting devices assembled on the assembly substrate onto a transfer substrate; and transferring the semiconductor light-emitting devices transferred to the transfer substrate onto a wiring substrate, wherein the assembly substrate and the wiring substrate include two or more pixel areas having different arrangements of the semiconductor light-emitting devices, and the transferring the semiconductor light-emitting devices transferred to the transfer substrate onto the wiring substrate is performed based on at least one of the two or more pixel areas.

10. The method of claim 9, wherein each of the assembly substrate and the wiring substrate includes:

first pixel areas in which the semiconductor light-emitting devices are disposed in a first arrangement; and second pixel areas in which the semiconductor light-emitting devices are disposed in an arrangement different from the first arrangement, and wherein the transferring the semiconductor light-emitting devices transferred to the transfer substrate onto the wiring substrate is performed based on the second pixel areas.

11. The method of claim 9, wherein the assembly substrate and the transfer substrate include first alignment patterns, respectively, and the transferring the semiconductor light-emitting devices assembled on the assembly substrate to the transfer substrate includes:

aligning the transfer substrate on one side of the assembly substrate so that the first alignment patterns of the assembly substrate and the transfer substrate overlap each other; and bonding the assembly substrate and the transfer substrate.

12. The method of claim 10, wherein the transfer substrate and the wiring substrate include first alignment patterns, respectively, and the transferring the semiconductor light-emitting devices transferred to the transfer substrate onto the wiring substrate includes:

aligning the transfer substrate on one side of the wiring substrate so that the first alignment patterns of the transfer substrate and the wiring substrate overlap each other;

aligning the transfer substrate on one side of the wiring substrate by recognizing the semiconductor light-emitting devices transferred to the transfer substrate in an arrangement corresponding to the arrangement in the second pixel area; and bonding the transfer substrate and the wiring substrate.

13. The method of claim 12, wherein the transfer substrate includes semiconductor light-emitting devices disposed in an arrangement corresponding to the arrangement in the second pixel area in the vicinity of at least two or more corners after the semiconductor light-emitting devices assembled on the assembly substrate is transferred to the transfer substrate.

14. The method of claim 11, wherein the transfer substrate includes a plurality of first alignment patterns adjacent to corners, and the assembly substrate and the wiring substrate include the first alignment patterns at positions corresponding to the first alignment patterns of the transfer substrate.

15. The method of claim 9, wherein the transferring the semiconductor light-emitting devices transferred to the transfer substrate onto the wiring substrate is performed repeatedly a plurality of times.

16. The method of claim 9, wherein the assembling the semiconductor light-emitting devices on the assembly substrate is configured to self-assemble the semiconductor light-emitting devices in a fluid on the assembly substrate using an electric field and a magnetic field.

17. The method of claim 16, wherein the semiconductor light-emitting devices include a first semiconductor light-emitting device emitting blue light and having a first shape, a second semiconductor light-emitting device emitting green light and having a second shape, and a third semiconductor light-emitting device emitting red light and having a third shape, and the assembling the semiconductor light-emitting devices on the assembly substrate is configured to simultaneously assemble the first to third semiconductor light-emitting devices on the assembly substrate.

18. The method of claim 9, further comprising electrically connecting the semiconductor light-emitting devices transferred to the wiring substrate and the wiring substrate.

\* \* \* \* \*